US008135550B2

(12) United States Patent
Bose et al.

(10) Patent No.: US 8,135,550 B2
(45) Date of Patent: Mar. 13, 2012

(54) SYSTEM FOR MONITORING AND ASSESSING ELECTRICAL CIRCUITS AND METHOD OF OPERATION

(75) Inventors: Sanjay Bose, West Edison, NJ (US); Anthony T. Giuliante, Galloway, NJ (US); Amir Makki, Northfield, NJ (US); Maria Rothweiler Makki, Northfield, NJ (US)

(73) Assignees: Consolidated Edison Company of New York, Inc., New York, NY (US); Softstuf, Inc., Philadelphia, PA (US)

( * ) Notice: Subject to any disclaimer, the term of this patent is extended or adjusted under 35 U.S.C. 154(b) by 593 days.

(21) Appl. No.: 12/331,043

(22) Filed: Dec. 9, 2008

(65) Prior Publication Data

US 2010/0145641 A1 Jun. 10, 2010

(51) Int. Cl.
*G01R 13/04* (2006.01)
*G01R 13/02* (2006.01)
*G01R 33/36* (2006.01)
*G06F 3/05* (2006.01)

(52) U.S. Cl. .............. 702/58; 702/57; 702/69; 702/182

(58) Field of Classification Search ................ 702/58, 702/60, 62, 85, 117, 181, 182, 188, 57, 69; 376/259; 700/17
See application file for complete search history.

(56) References Cited

U.S. PATENT DOCUMENTS

| | | | |
|---|---|---|---|
| 4,661,310 A * | 4/1987 | Cook et al. ................ 376/259 |
| 4,855,671 A | 8/1989 | Fernandes | |
| 5,164,875 A | 11/1992 | Haun et al. | |
| 5,550,662 A * | 8/1996 | Bos ........................... 349/117 |
| 5,805,813 A | 9/1998 | Schweitzer, III | |
| 6,369,995 B1 | 4/2002 | Kagawa et al. | |
| 6,421,571 B1 * | 7/2002 | Spriggs et al. .............. 700/17 |
| 6,437,692 B1 | 8/2002 | Petite et al. | |
| 6,535,797 B1 | 3/2003 | Bowles et al. | |
| 6,795,789 B2 | 9/2004 | Vandiver | |
| 6,795,798 B2 * | 9/2004 | Eryurek et al. ............. 702/188 |
| 7,043,381 B2 | 5/2006 | Wakida et al. | |
| 7,053,767 B2 | 5/2006 | Petite et al. | |
| 7,062,359 B2 | 6/2006 | Bjorklund | |
| 7,182,283 B1 * | 2/2007 | Santucci ..................... 241/37 |
| 7,369,950 B2 | 5/2008 | Wall et al. | |
| RE40,569 E | 11/2008 | Schweitzer, III et al. | |
| 7,468,661 B2 | 12/2008 | Petite et al. | |

(Continued)

OTHER PUBLICATIONS

S. Bhatt "The Application of Power Quality Monitoring Data for Reliability Centered Maintenance" EPRI (2000) 152 pages; Electric Power Research Institute, Inc.
International Search Report dated Jul. 2, 2010 for International Application No. PCT/US2009/065533.

(Continued)

*Primary Examiner* — Edward Raymond
*Assistant Examiner* — Felix Suarez
(74) *Attorney, Agent, or Firm* — Cantor Colburn LLP

(57) ABSTRACT

A system for collecting data and monitoring the operation of electrical circuits, such as branch circuits at a substation is provided. The system collects data from a plurality of sensors coupled to a plurality of electrical equipment associated with a circuit. The data from the sensors is collected and used to determine the activation of the electrical equipment, such as a protective relay for example. The data is further transformed to allow assessment of the circuit's performance against desired parameters.

27 Claims, 19 Drawing Sheets

U.S. PATENT DOCUMENTS

| | | |
|---|---|---|
| 2004/0125532 A1 | 7/2004 | Schweitzer, III |
| 2005/0030693 A1 | 2/2005 | Deak et al. |
| 2005/0270720 A1 | 12/2005 | Johnson, Jr. |
| 2008/0103732 A1 | 5/2008 | Stoupis et al. |
| 2008/0183406 A1 | 7/2008 | Lee et al. |

OTHER PUBLICATIONS

Written Opinion of the International Searching Authority mailed Jul. 2, 2010 for International Application No. PCT/US2009/065533.

* cited by examiner

| TRIGDATE | TIME | DUR (MSEC) | MAX (AMPS) | DESCRIPTION |
| --- | --- | --- | --- | --- |
| 04/10/2008 | 15:08:51.921 | 38.38 | 6.013 | (1) –50/51 A |
| 04/10/2008 | 15:08:51.921 | 40.14 | 6.652 | (4) –50/51 N |
| 04/10/2008 | 15:08:51.944 | 23.74 | 7.851 | (5) –TRIP 6E |
| 04/10/2008 | 15:08:51.944 | 39.43 | 12.583 | (6) –TRIP 7E |
| 04/10/2008 | 15:09:05.046 | 338.78 | 4.686 | (1) –LOR TRIP |
| 04/10/2008 | 15:09:05.046 | 338.78 | 4.433 | (2) –RESET |
| 04/10/2008 | 15:09:05.046 | 336.66 | 3.550 | (3) –MONITOR |
| 04/10/2008 | 15:09:05.046 | 331.14 | 2.849 | (4) –7E TIMER |
| 04/10/2008 | 15:09:05.046 | 330.30 | 1.836 | (7) –6E TIMER |

FIG. 7

SYSTEM FOR MONITORING AND ASSESSING ELECTRICAL CIRCUITS AND METHOD OF OPERATION

BACKGROUND OF THE INVENTION

The present invention relates generally to electrical power transmission and distribution networks and more particularly to a system for monitoring electrical characteristics of electrical circuits and for assessing the performance and capacity of the electrical circuit.

Electrical power is typically produced at centralized power production facilities and transferred at high voltages to local substations. The local substations transform the electrical power to a medium or low voltage. The electrical power is subsequently distributed through feeders to local distribution networks Electrical utilities have a number of metrics that are used to track performance and customer satisfaction. These metrics, which include the system average interruption frequency index ("SAIFI"), the customer average interruption duration index ("CAIDI"), and for some utilities, the momentary average interruption frequency index ("MAIFI"). SAIFI measures the average number of interruptions that a customer would experience during a time period, such as a year. CAIDI measures the duration of the interruption that a customer would experience, and is generally a few hours per year. MAIFI measures the number of power interruptions that have a duration of less than five minutes that a customer would experience during a given time period. Some or all of these metrics are also used by government regulators to aid in determining if the electrical utility is adhering to the regulations in maintaining a durable and reliable electrical service Thus, it is desirable for the utilities to monitor the health and performance of their electrical network to ensure customer satisfaction and compliance with governmental regulations. Advanced electrical networks, sometimes referred to as "Smart Grid" apply advanced sensors and two-way communications technologies to keep track of the network operations from the generation plant to the electrical outlets in a customers residence. When fully implemented, the Smart Grid will allow for generators, distribution equipment and loads to interact in real time. Electrical demand or variances in electrical characteristics may then be actively managed, reducing wear on equipment and improving reliability.

The ability of these advanced sensors to monitor and record electrical characteristics provides the electrical utilities with a large amount of information, including but not limited to voltage, current, real power, and reactive power for example. When the sensor network is expanded to monitoring many electrical circuits, the large volume of information becomes difficult for electrical utility personnel to utilize. This problem increases in complexity as the sampling rate of the sensor becomes larger.

One of the impediments to the implementation of Smart Grid is the existence of legacy systems and equipment, such as electromechanical relays for example. This equipment is in widespread use making replacement costly and time consuming. One further difficulty is that this equipment is often difficult to retrofit with modern communications capability. As a result, when protective equipment, such as a protective relay for example, is activated, utility personnel must travel to the location and manually inspect the equipment. Often the only indication will be a mechanical visual indicator, sometimes referred to as a "target flag."

Thus, while existing electrical network monitoring systems are suitable for their intended purpose, there remains a need for improvements. In particular, there remains a need for improvement regarding the ability to monitor and analyze information collected from sensors coupled to an electrical network and assess the performance and capacity of the electrical network.

SUMMARY OF THE INVENTION

A method of identifying a relay is provided. The method includes the step of coupling a first plurality of sensors to a relay trip ladder, wherein each of the first plurality of sensors is associated with one of a plurality of relays. A first electrical data set is collected from the first plurality of sensors. A trip signal is identified on the trip ladder. It is then determined which relay from the plurality of relays generated the trip signal from the first electrical data.

A method of identifying an activated relay in a protective relay cabinet is provided. The protective relay cabinet includes a first relay, a second relay and a third relay, and each relay being operably coupled to a circuit breaker by a trip ladder. The method includes coupling a first sensor to the trip ladder adjacent the first relay. A second sensor is coupled to the trip ladder adjacent the second relay. A third sensor is coupled to the trip ladder adjacent the third relay. A trip signal is detected on the trip ladder. It is determined which of the first sensor, the second sensor or the third sensor measured the trip signal. It is then determined that the second relay generated the trip signal.

A method of assessing an electrical circuit is also provided. The method includes the step of collecting a first data set representing a first electrical parameter. A second data set is collected representing a second electrical parameter. A graphical plot is created of the first data set and the second data set. A characteristic of the graphical plot is compared to a threshold parameter. It is determined whether the threshold parameter has been violated by the characteristic.

A method of assessing an electrical circuit is also provided. The method includes the step of collecting a first data set representing a first electrical parameter. A second data set is collected representing a second electrical parameter. A third data set is collected representing a third electrical parameter. The first data set, the second data set and the third data set are stored. A polar plot of the stored first data set, the stored second data set, and the stored third data set is generated. A characteristic of the polar plot is compared to a threshold parameter. An action is initiated if the threshold parameter has been violated by the characteristic.

A system for assessing an electrical circuit is also provided. The system includes a first sensor for measuring a first electrical parameter of the electrical circuit. A second sensor for measuring a second electrical parameter of the electrical circuit. A data storage device is operably coupled to store data received from the first sensor and the second sensor. A controller responsive to executable computer instructions when executed on the controller for generating a polar plot of the stored data. The controller further responsive to executable instructions to compare a characteristic of the polar plot to a threshold parameter and determining if the threshold parameter has been exceeded.

BRIEF DESCRIPTION OF THE DRAWINGS

Referring now to the drawings, which are meant to be exemplary and not limiting, and wherein like elements are numbered alike:

FIG. 7 is an exception report in accordance with an exemplary embodiment of the invention;

DETAILED DESCRIPTION

Figure 1:
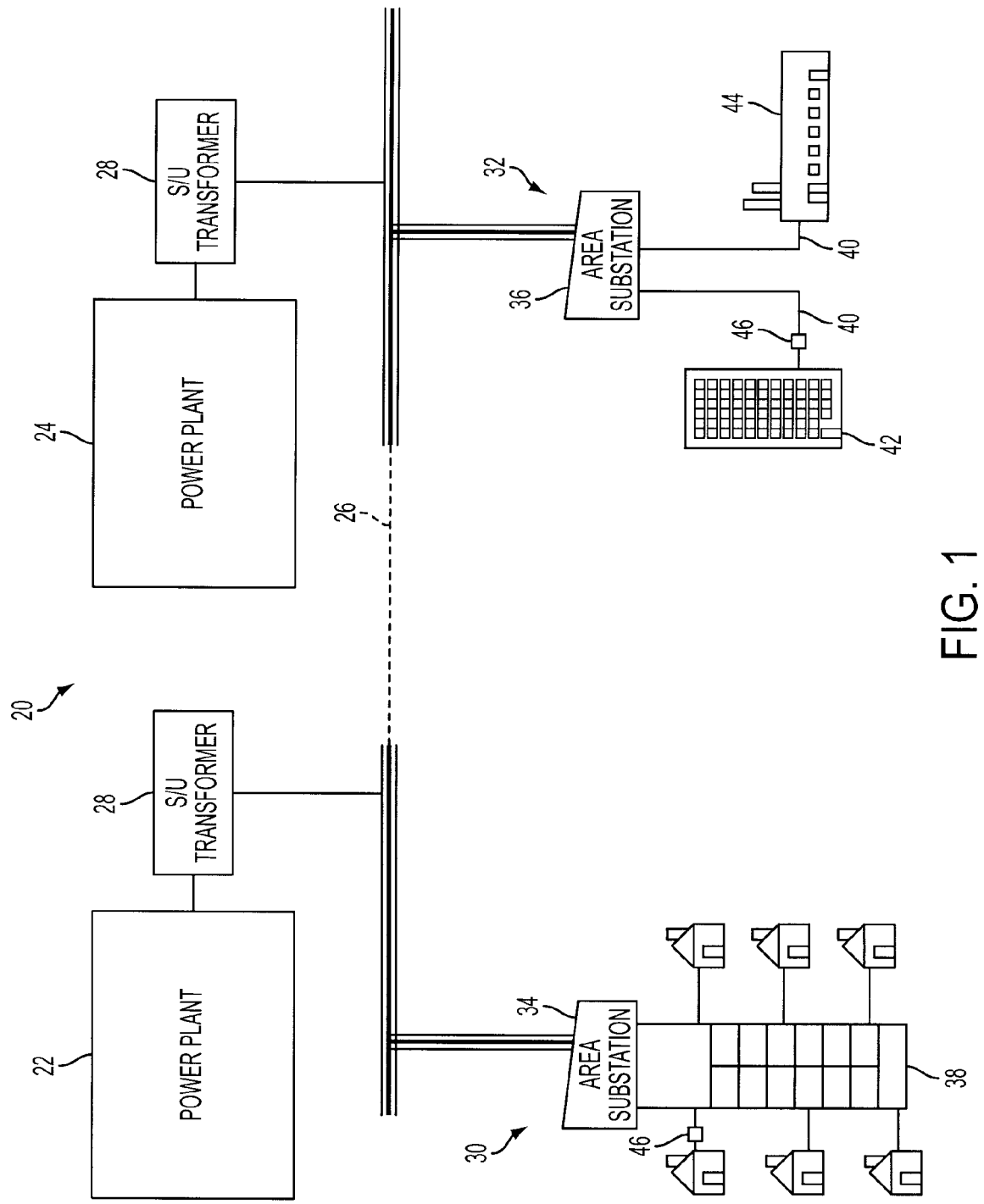
FIG. 1 is a schematic illustration of a utility electrical transmission and distribution system.

FIG. 1 illustrates an exemplary embodiment of a utility electrical transmission and distribution system 20. The utility system 20 includes one or more power plants 22, 24 connected in parallel to a main transmission system 26 by multiple step-up transformers 28. The power plants 22, 24 may include, but are not limited to: coal, nuclear, natural gas, or incineration power plants. Additionally, the power plants 22, 24 may include one or more hydroelectric, solar, or wind turbine power plants. The step-up transformers 28 increase the voltage from that produced by the power plants 22, 24 to a high voltage, such as 138 kV for example, to allow long distance transmission of the electric power over main transmission system 26. It should be appreciated that additional components such as transformers, switchgear, fuses and the like (not shown) may be incorporated into the transmission and distribution system 20 as needed to ensure the safe and efficient operation of the system. The transmission and distribution system 20 is typically interconnected with one or more other utility networks to allow the transfer of electrical power into or out of the transmission and distribution system 20.

The main transmission system 26 typically consists of high voltage transmission power lines, anywhere from 69 KV to 500 KV for example, and associated transmission and distribution equipment which carry the electrical power from the point of production at the power plant 22 to the end users located on local electrical distribution systems 30, 32. The local distribution systems 30, 32 are connected to the main distribution system by area substations 34, 36 that are connected to the first distribution system 30 and second distribution system 32 respectively. The area substations 34, 36 reduce the transmission voltage to distribution levels such as 13 KV, 27 KV or 33 KV for the end users. Area substations 34, 36 typically contain three or more transformers, switching, protection and control equipment as well as circuit breakers to interrupt faults such as short circuits or over-load currents that may occur. Substations 34, 36 may also include equipment such as but not limited to fuses, surge protection, controls, meters, capacitors, load tap changers and voltage regulators for example.

It should be appreciated that the substations 34, 36 may both be connected to a single power plant, such as first power plant 22 for example. Alternatively, they may be connected to the main transmission system 26 such that the substations 34, 36 receive electrical power from different power stations, such as substation 34 receives electrical power from first power plant 22 and substation 36 receives electrical power from second power plant 24 as illustrated in FIG. 1 for example.

The area substations 34, 36 connect to one or two local electrical distribution networks 38, 40 respectively. These local networks 38, 40 provide electrical power to an area, such as a residential area or commercial zone for example. The local networks 38, 40 also include additional equipment, such as transformers 46 that adapt the voltage from that output by the substations 34, 36 to that usable by the end customers. For example, the substation 34 may distribute electrical power at 13 kV. The transformer 46 lowers the voltage to 120V/208V, which is usable by a residence. The local networks 40 may be a commercially zoned area having an office building 42 or a manufacturing facility 44 for example.

Figure 2:
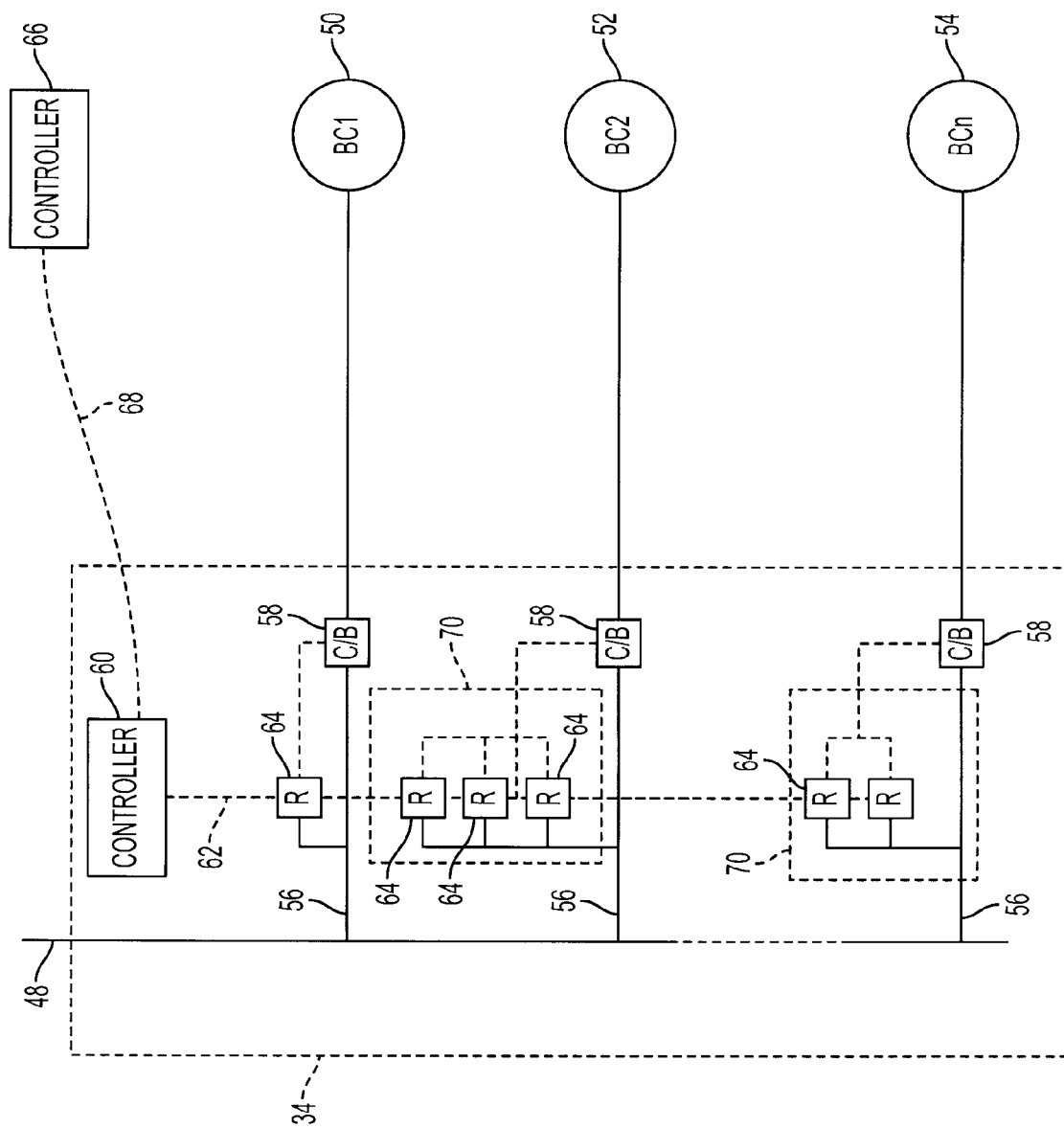
FIG. 2 is an schematic illustration of a substation of FIG. 1.

Referring now to FIG. 2, an exemplary substation system 34 will be described. The substation 34 receives electrical power from the main transmission network 26 via connection 48. The connection 48 is part of a plurality of feeders 56 within the substation 34. A feeder is a device that allows the utility to receive the incoming electrical power and subdivide the electrical power into discrete branch circuits 50, 52, 54 connected to the substation 34. Usually, each feeder 56 includes a circuit breaker 58 that allows the connection and disconnection of the substation from the local network 38, 40. It should be appreciated that substation 34 and feeders 56 may include additional equipment (not shown) such as but not limited to switches, transformers, fuses, capacitors and voltage regulators for example. It should further be appreciated that a substation may have any number of feeder circuits and that these circuits are discussed herein for illustration purposes.

In the exemplary embodiment, the substation 34 also includes a controller 60. The controller 60 may be any suitable device capable of receiving multiple inputs and providing control functionality to multiple devices based on the inputs. Controller 60 includes a processor that is a suitable electronic device capable of accepting data and instructions, executing the instructions to process the data, and presenting the results. The processor may accept instructions through a user interface, or through other means such as but not limited to electronic data card, voice activation means, manually operable selection and control means, radiated wavelength and electronic or electrical transfer. Therefore, the processor can be a microprocessor, microcomputer, a minicomputer, an optical computer, a board computer, a complex instruction set computer, an ASIC (application specific integrated circuit), a reduced instruction set computer, an analog computer, a digital computer, a molecular computer, a quantum computer, a cellular computer, a superconducting computer, a supercomputer, a solid-state computer, a single-board computer, a buffered computer, a computer network, a desktop computer, a laptop computer, or a hybrid of any of the foregoing.

The controller 60 is coupled to communicate with external devices via communications medium 62. These devices include protective relays 64 and circuit breakers 58 for example. Controller 60 may also communicate with external devices, such as a controller 66 associated with a central control facility via a communications medium 68. It should be appreciated that the communications mediums 62, 68 may be any suitable communications means, including wired or wireless, capable of quickly and reliably transmitting information. The communications mediums 62, 68 may also be radio connection in the 900 MHz spectrum, a leased telecommunications line (e.g. X.25, T1), a fiber network, a PSTN POTS network, a DSL telecommunications line, a cable telecommunications line, a microwave connection, a cellular connection, or a wireless connection using the IEEE 802.1 standard.

It should be appreciated that while the exemplary embodiment illustrates the controllers 60, 66 as discrete components, these devices may also be integrated into a single device that provides control functionality over both substations 34 and a central control facility. Further, the functionality of the controllers 60, 66 that are described herein may be distributed among several controllers that provide the control functionality.

It should be appreciated that the second substation 36 is arranged similarly to the first substation 34.

As discussed above, the substation 34 includes a number of different types of equipment, such as protective relays 64 and circuit breakers 58 for example, that provide the functionality needed to divide the incoming electrical power into the branch circuits 50, 52, 54. Even within these general categories, there may be different types or versions of the equipment. In the case of the protective relays 64, they may be an overcurrent, directional ground fault, or time-instantaneous type of protective relay for example. In some instances, multiple protective relays may be coupled to a branch circuit, such as the branch circuits 52, 54 for example. This allows the utility to design its protection scheme to address issues that may occur. Similar to the protective relays, different types of circuit breakers 58 may be installed, such as a switchgear or an autorecloser type circuit breaker for example.

Figure 3:
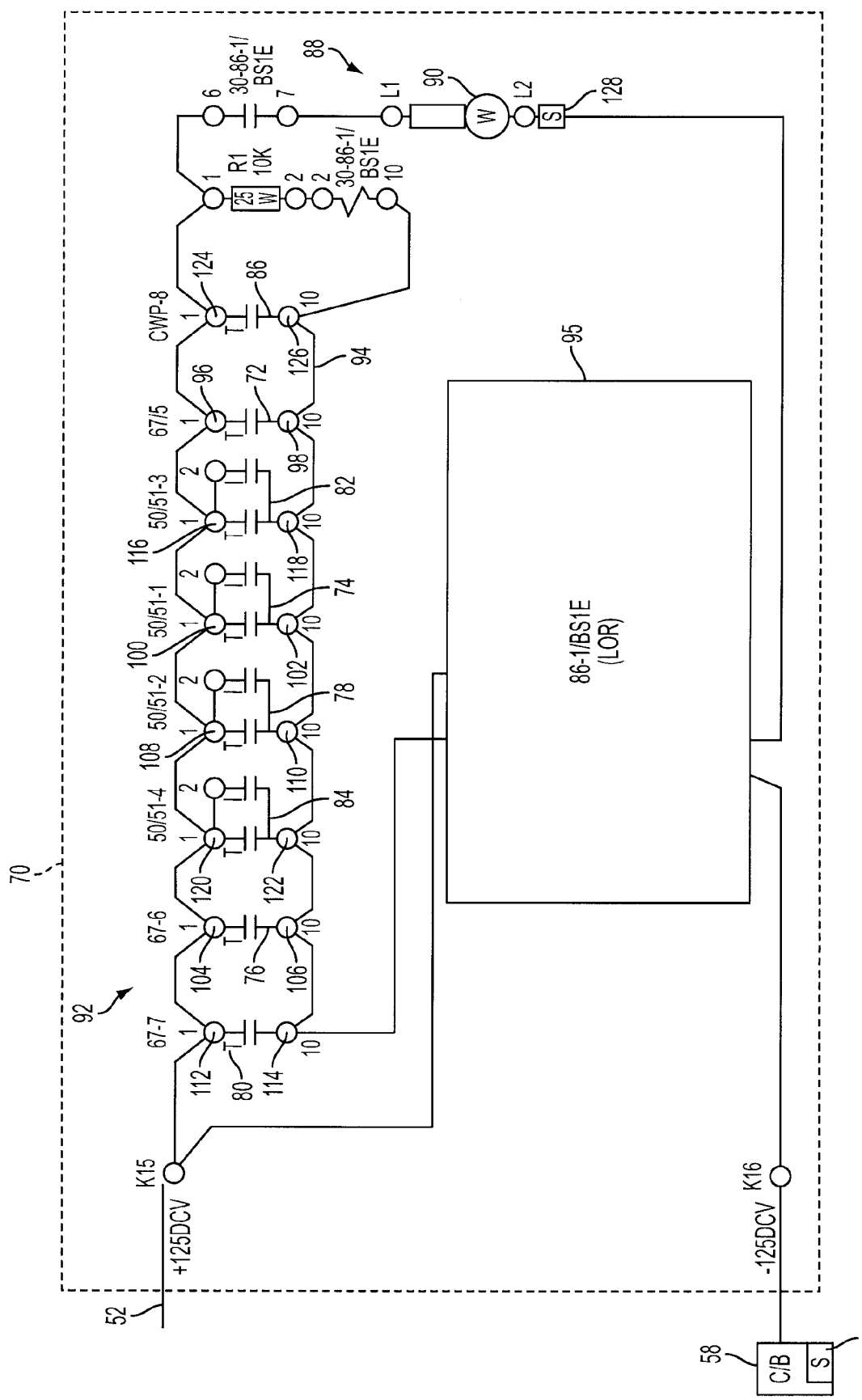
FIG. 3 is a schematic illustration of a protective relay panel of FIG. 2 in accordance with an embodiment of the invention.

The protective relays 64 are typically housed in a protective relay panel 70. In an average sized substation, there may be as many as 100 protective relay panels. The panel 70 provides a housing for protecting relays 64 from the environment and for controlling the routing of the many cables needed to connect the relays 64 to a branch circuit. In the embodiment illustrated in FIG. 3, the panel 70 includes three different types of protective relays, an overload relay, a time-instantaneous relay and a directional ground fault relay. In the exemplary embodiment, the branch circuit 52 is a three-phase circuit; therefore, each phase of the branch circuit 52 has multiple protective relays. For example the protective scheme for Phase A includes an overload relay 72, and a time-instantaneous relay 74. The protective scheme for Phase B includes an overload relay 76 and a time instantaneous relay 78, while Phase C includes overload relay 80 and time instantaneous relay 82. Finally, a time-instantaneous relay 84 and a potential polarized directional ground fault relay 86 are coupled to the neutral conduit. It should be appreciated that each of the protective relays 64 includes an individual conduit that connects the relay to the respective phase of the branch circuit. As a result, the panel 70 is often crowded with a multitude of cables. To ensure that no breaks occur in the conduits, an indicator circuit 88 having a light or lamp 90 is coupled to the relay circuit. The indicator lamp 90 provides utility personnel with a visual indication as to the status of the electrical connections within the panel 70.

Each of the protective relays 64 includes two connections. A load side connection 92 couples each relay 64 to a secondary side of a current transformer (not shown) that is electrically coupled to the branch circuit. A current transformer is a device that includes a primary winding that is placed around the branch circuit conductor. The primary winding induces a current in a secondary winding that is proportional to the current flowing through the branch circuit conductor. Since the current in the secondary winding is lower than the actual circuit conductor, measurement devices such as relays 64 may be coupled to the secondary winding without risking damage to the measurement device.

The protective relays second connection is to a trip bus, or trip ladder 94. The trip bus 94 connects each of the relays 64 in series to a lockout relay (LOR) 95. A LOR 95 is a relay that is connected to circuit breaker 58 that in response to receiving a signal from the trip bus 94, the LOR 95 transmits a signal to circuit breaker 58 causing it to trip and interrupt the flow of current.

In the exemplary embodiment, the relays 64 are electromechanical type relays. Electromechanical protective relays have been used in the electrical utility industry for many years and are widespread throughout the electrical grid infrastructure. While these relays provide highly accurate and reliable service, they lack communications circuitry found in modern digital devices. As will be discussed in more detail below, the relays 64 are coupled to a circuit breaker 58 and provide a tripping signal that causes the circuit breaker 58 to open and interrupt electrical power. Since the electromechanical relays do not have communications capability, when a fault occurs, the utility must send utility personnel to the substation to determine which relay was activated and caused the circuit breaker to trip. On most electromechanical relays, the only indication that the relay activated is a mechanical visual indicator referred to as a target flag. Unfortunately, target flags sometimes are not visible (stuck in the off position) or always remain visible (stuck in the on position). Thus, it is often difficult for the utility personnel to determine which relay activated and troubleshoot the root cause of the original electrical fault.

It should be appreciated that due to the widespread use of the electromechanical relays, large-scale replacement of these devices is cost prohibitive. In the exemplary embodiment, remote monitoring capability is provided to the electromechanical relays 64 by clamp-on sensors coupled to connections 92, 94 at each relay 64. The sensors may be hall effect sensors, such as those further described in co-pending U.S. patent application Ser. No. 12/249,547, filed on Oct. 10, 2008, the full disclosure of which is incorporated herein by reference. Thus a pair of sensors is associated with each relay 64, one on the load side 92, and one on the trip bus side 94. As such, overload relay 72 has a load sensor 96 and a trip sensor 98; time-instantaneous relay 74 has a load sensor 100 and a trip sensor 102; overload relay 76 has a load sensor 104 and a trip sensor 106; time-instantaneous relay 78 has a load sensor 108 and a trip sensor 110; overload relay 80 has a load sensor 112 and a trip sensor 114; time-instantaneous relay 82 has a load sensor 116 and a trip sensor 118; time-instantaneous relay 84 has a load sensor 120 and a trip sensor 122 and directional ground fault relay 86 has a load sensor 124 and a trip sensor 126. Additionally, a sensor 128 is coupled to the indicator circuit 88 at the outlet of the lamp 90 and sensors 130 are coupled to the circuit breaker 58 to measure current flowing through the circuit breaker 58.

Each of the plurality of sensors 96-130 is coupled to a controller, such as controller 60 for example, that collects, stores and analyzes data being transmitted by the sensors 96-130. In this embodiment, the controller 60 may be comprised of a number of individual computers that are connected to the sensors 96-130 to provide redundant data collection, storage and analysis.

Figure 4:
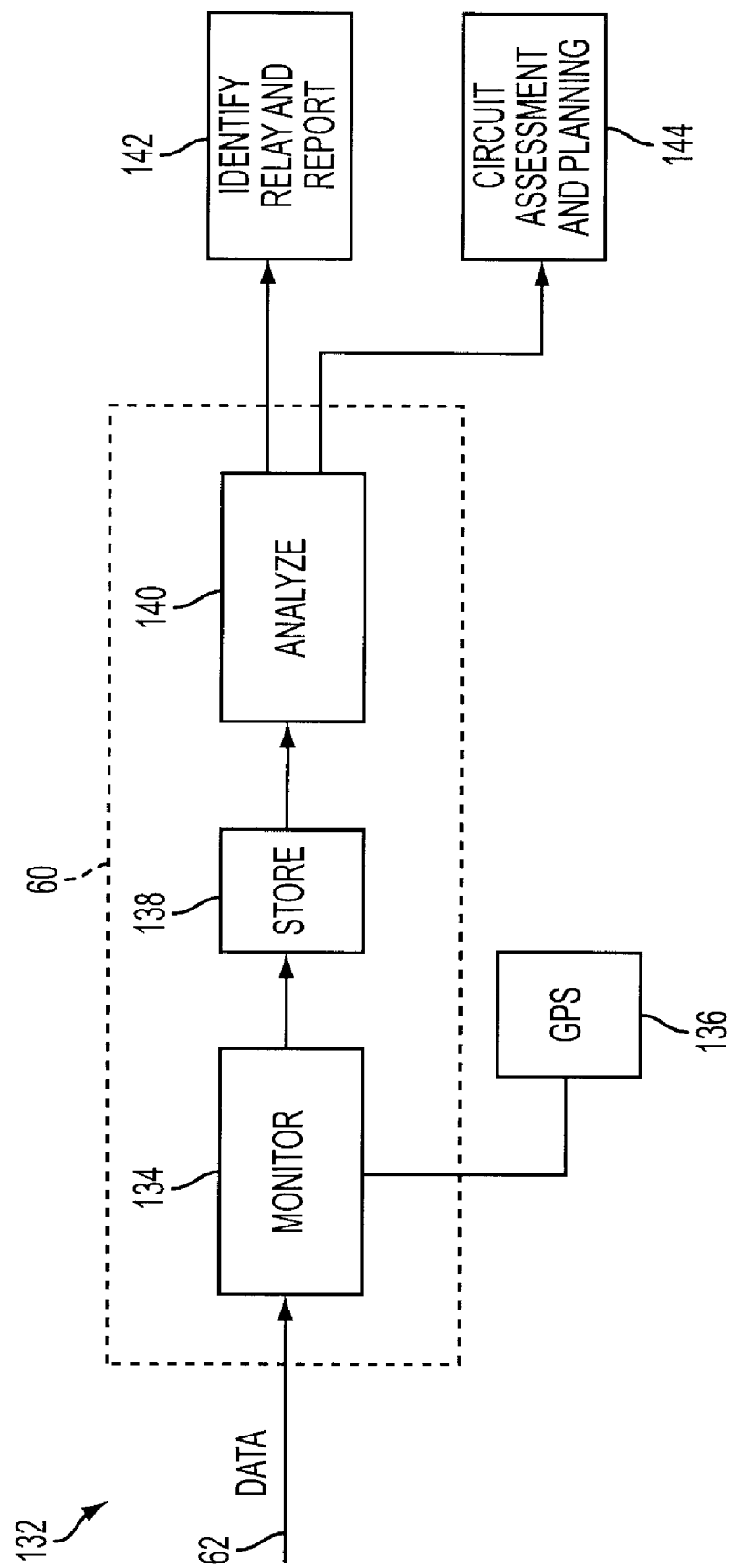
FIG. 4 is a schematic block diagram illustration of a process for monitoring and analyzing electrical system data in accordance with one embodiment of the invention.

Referring now to FIG. 4, the process for assessing electrical circuits will be described. In the exemplary embodiment, the data 132 is transmitted over communications medium 62 to controller 60. The data 132 may include but is not limited to current, voltage, real power, reactive power, sensor identification, measurement date, and measurement time for example. In one embodiment, the data 132 is transmitted in discrete data packets. The data 132 is received by controller 60 which continuously monitors 134 the flow of data. Data from a global positioning system (GPS) 136 provides a means for aligning data received from multiple sensors to a common time base. The data is then stored 138 and analyzed 140 in real time for anomalies or deviations from an expected condition. The analyzed data then could be used for a number of different purposes, such as for identifying 142 an activated relay or for assessing 144 circuit performance and planning.

Figure 5:
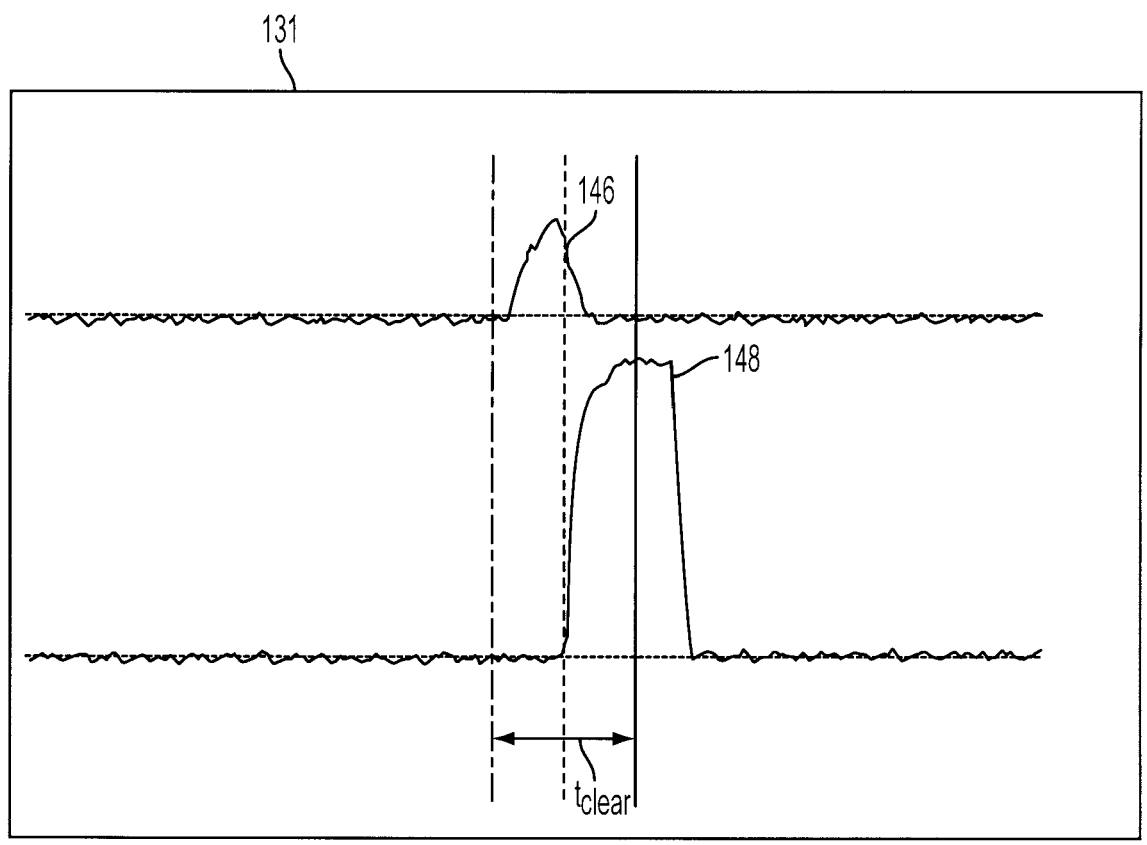
FIG. 5 is a graph illustrating an electrical data from a relay and circuit breaker of FIG. 2.

An exemplary graphical depiction of a computer window 131 illustrating the data 132 collected by the controller 60 is shown in FIG. 5. For exemplary purposes, FIG. 5 will be described as the time-instantaneous relay 82 being activated and the circuit breaker 58 interrupting the branch circuit 52. Upon the detection of an undesired condition, such as a short circuit for example, the time-instantaneous relay 82 transmits a signal onto to the trip bus 94 to the LOR 95. The LOR 95 in turn transmits a signal to the circuit breaker 58 which trips or opens halting the flow of current in branch circuit 52. When the time-instantaneous relay 82 transmits the signal to the LOR 95, the trip sensor 118 detects the signal on the trip bus 94 and transmits data to the controller 60. A graphical representation of the trip signal data is illustrated by line 146 in FIG. 5. Similarly, when the circuit breaker 58 opens, the current sensors 130 detect the change in current as illustrated by line. This allows the controller 60 to monitor the length of time $t_{clear}$ from the point where the time-instantaneous relay 82 detects the fault to the point where the circuit breaker interrupts the flow of current. It is desirable for the utility to monitor these parameters as they are an indication of the health of the protection scheme. This time $t_{clear}$, and the profile of line 148 may be tracked over time to determine when the circuit breaker needs maintenance (e.g. $t_{clear}$ exceeds a threshold), or if breaker 58 has malfunctioned (e.g. the circuit breaker is stuck and does not clear the fault even though the relay transmitted a trip signal).

It should be appreciated that since the relays 64 that are coupled to the trip bus are arranged in a serial manner, the trip signal 146 is received not just by the sensor coupled to the relay transmitting the trip signal, but rather by each of the sensors positioned between the activated relay and the LOR 95. In the example given above, the signal 146 will be measured and transmitted by each of the sensors 102, 122, 106, 114. Thus, the controller 60 ascertains the sensor furthest from the LOR 95 on the bus 94 to determine which relay was activated.

It should further be appreciated that in the event two relays simultaneously activate, the signal on the trip bus 94 will be measured at a first level for some of the sensors and at a second level for a second group of sensors. The reason is that when the downstream relay injects its trip signal onto the trip bus 94, this signal is additive to the trip signal transmitted by the upstream relay. For example, if time-instantaneous relays 82 and 84 simultaneously activate (e.g. Phase C to Neutral fault), then sensors 118, 102, 110 will measure a signal such as that illustrated by line 146 in FIG. 5. However, sensors 122, 106, 114 will measure the signal from time-instantaneous relay 82 combined with the signal from time-instantaneous relay 84. Thus, the controller 60 may determine when multiple relays have activated by monitoring for changes in the current level of the trip signal.

Figure 6:
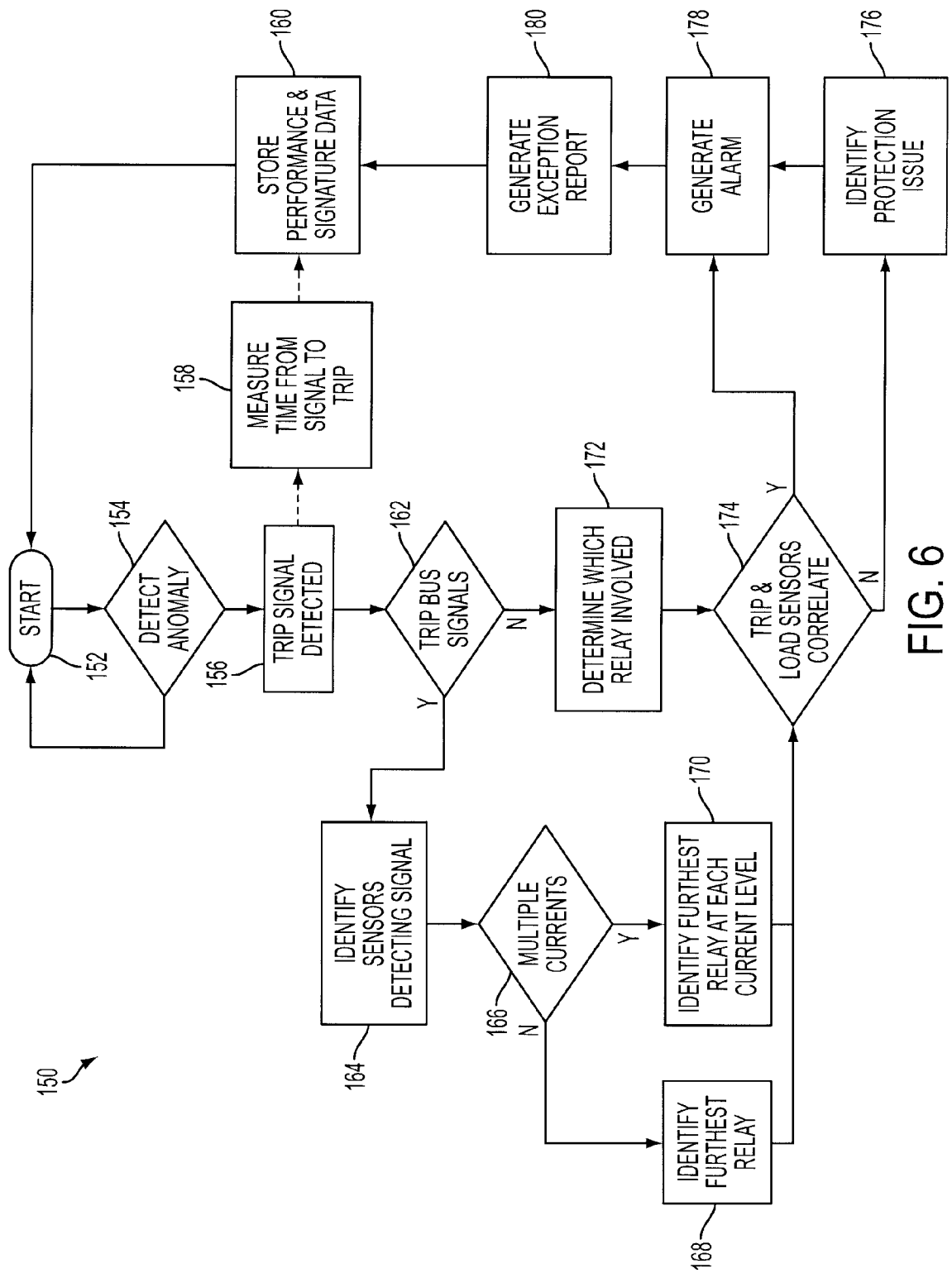
FIG. 6 is flow chart illustrating a method for determining which relay activated in the protective relay panel of FIG. 3.

A process 150 for collecting and analyzing utility data is shown in FIG. 6. In this embodiment, the process 150 begins in start block 152 and proceeds to query block 154 where it is determined if an anomaly has been detected in the data received from the plurality of sensors 96-130. The anomaly can take the form of any deviation from the expected operating parameters. The anomaly may include a trip signal measured by one or more sensors on the trip bus 94, an indication of an electrical fault from one of the load sensors 96, 100, 104, 108, 112, 116, 124, or an indication that the circuit breaker 58 has tripped. If the query block 154 returns a negative, the process 150 loops back to start block 152 and the process begins again.

If the query block 154 returns a positive, meaning that an anomaly has been detected, a trip signal is transmitted by the LOR 95 to the circuit breaker 58 in block 156. The process 150 then bifurcates proceeding along two parallel paths. The first path measures the time for the circuit breaker 58 to open or interrupt the current flow in block 158 and stores the information in block 160. While the circuit breaker 58 opening is being measured, the process 150 proceeds to query block 162 to determine if a signal was measured on the trip bus 94.

If query block 162 returns an affirmative response, the process proceeds to block 164 where the sensors that measured the trip signal are identified. As discussed above, since the protective relays 64 are coupled to the trip bus 94 in a serial manner, all sensors downstream from the activated relay will measure the trip signal. The process then proceeds to query block 166 where the signals measured by each of the identified sensors are interrogated to determine if multiple current levels were detected. If some of the sensors measure the trip signal at one current level, and a second group measure the trip signal at a second, higher current level, then this indicates that multiple relays activated simultaneously. It should be appreciated that the measured current will increase downstream for each relay that activates, so if three relays activate, there will be three current levels identified.

If query block 166 returns a negative, then the process 150 proceeds to block 168 where the activated relay is identified by determining which of the sensors that detected the trip signal 146 is farthest from the LOR 95. For example, if sensor 118 detected the trip signal, but sensor 98 did not, then the process 150 would identify time-instantaneous relay 82 as being the activated relay. If query block 166 returns a positive, then the process 150 performs a similar analysis for each group of sensors that measure an identified current level in block 170. For example, if sensors 118, 102, 110 measure a trip signal with a current level L1, and sensors 122, 106, 114 measure a trip signal with a current L2, then process 150 determines which sensor is farthest from the LOR 95 at each current level. In the present example, the process 150 would determine that the sensor 122 measures current level L2 and the sensor 110 measures current level L1. Thus the time-instantaneous relay 84 would be identified as being activated. The process 150 would then proceed in a similar manner with sensors 118, 102, 110 and determine that sensor 118 measures a trip signal with current level L1 while sensor 98 does not measure a trip signal, thus time-instantaneous relay 82 would be identified as having activated.

If no trip signal is measured on the trip bus 94, query block 162 returns a negative and the process 150 proceeds to block 172. This circumstance may occur for example if sensor 130 indicates that the circuit breaker 58 has tripped, or if one or more load sensors measure electrical undesired characteristics on the branch circuit (e.g. elevated current levels). Block 172 determines which of the relays activated, or should have activated by examining the load sensor measurements for each of the load sensors 112, 104, 108, 100, 116, 96, 124.

Process 150 then proceeds either from blocks 168, 170 or from block 172 to query block 174. Query block 174 determines if an undesired electrical condition is detected at a load sensor but no corresponding trip signal is identified at the corresponding trip sensor. This circumstance may indicate a break in the protection scheme for the branch circuit, such as if a relay or sensor has failed. If query block 174 returns a negative, meaning that the measurements of the load sensor and trip sensor for the identified relay do not correlate, then the process 150 proceeds to block 176 where the protection scheme issue is identified. Block 176 may be automated, for example, identifying the issue through analysis of the sensor data, or may be an alert that is transmitted to dispatch a utility repair crew for prompt examination and servicing of the substation equipment.

If query block 174 returns a positive, or after the protection scheme issue has been identified in block 176, the process 150 proceeds to optional alarm block 178 where an alarm is generated. The alarm may take many different forms, such as an audible or visual alarm at the substation or at a central control station. Alternatively, the alarm may be in the form of an alpha-numeric pager, cell phone call, text message, instant message or email that is transmitted to designated individual(s). The process 150 then proceeds to block 180 where an exception report is generated. An exemplary exception report 182 is illustrated in FIG. 7. Due to the volume of data that is continuously being collected, it would be difficult for personnel monitoring the substation to detect errors or faults in the operation by reviewing the continuous flow of data. To resolve this, in the exemplary embodiment, the detected issues are reported on an exception basis. This allows the monitoring personnel to focus on the issues, problems and faults without having them get lost in the large quantity of data. In the embodiment shown in FIG. 7, the exception report includes a time-data field that the exception occurred, a fault duration field, a peak measurement field, and a textual description of which equipment generated the exception and the type of exception that occurred. It should be appreciated that the exception report may be in the form of a graphical display on a computer monitor at a control center, an email, a text message, a paper printout or an alphanumeric pager transmission. Also, the exception report may be generated on a periodic basis (e.g. once per hour) or on a continuous basis.

After generating the exception report, process 150 stores the data in block 160 and loops back to start block 152. It should be appreciated that while the process 150 has been described herein as being a linear or sequential set of steps, the process 150 may execute these steps in parallel, for example, when the process 150 bifurcates after block 156, or the analysis of the trip bus signal of blocks 164-170 may occur simultaneously with the analysis of the load sensor signals. Further, the process 150 may save data at any point during the process and not only at block 160.

Figure 8:
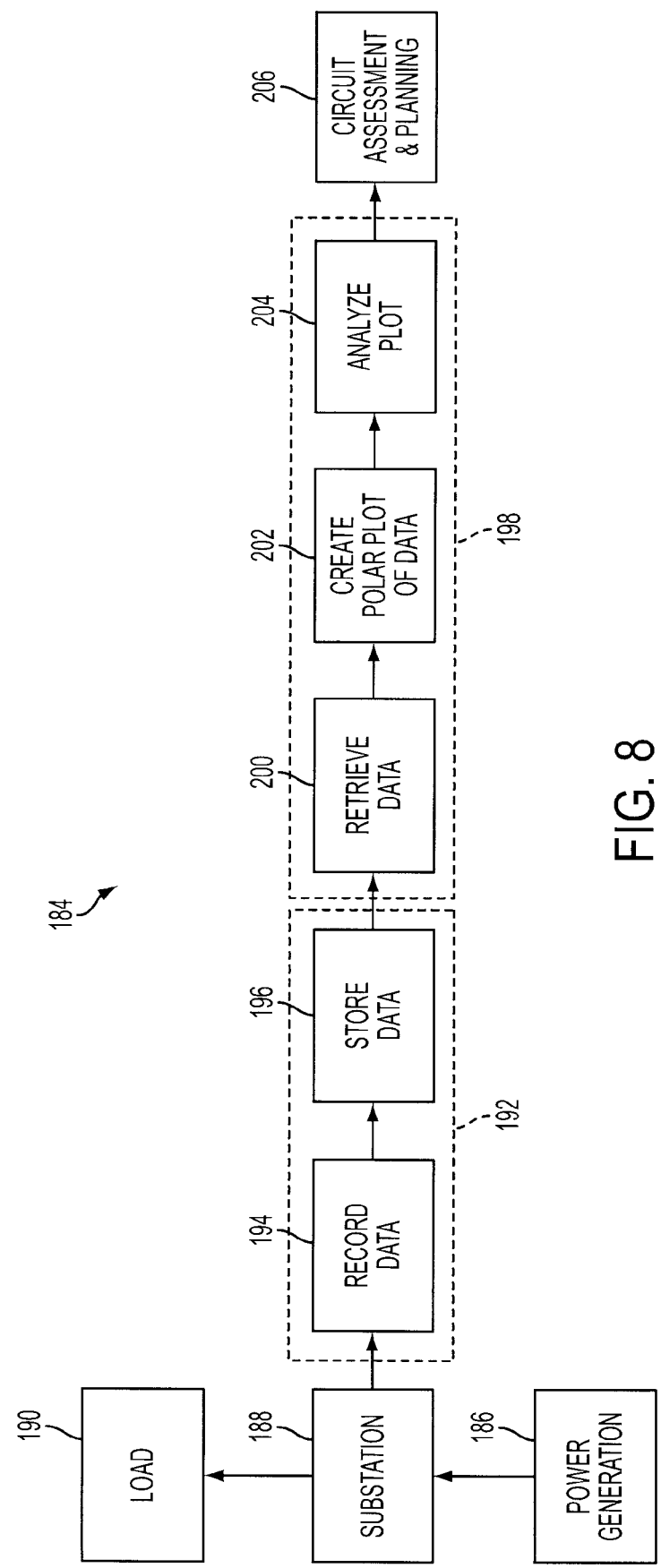
FIG. 8 is a schematic block diagram illustration of a process for assessing a circuit in accordance with one embodiment of the invention.

The system described herein may also be used for electrical circuit assessment and planning. This process makes use of the large quantities of data that are accumulated over time. An exemplary process 184 for assessing an electrical circuit is illustrated in FIG. 8. As discussed above, electrical power is generated 186 and transmitted through a substation 188 to an end load 190. Electrical characteristics data first collected 192 is by recording data 194 by the plurality of sensors 96-130 and storing data 196 for later analysis. The process then analyzes and transforms 198 the large quantities of data into a form that may be readily reviewed either by utility personnel or using additional computational techniques.

In the exemplary embodiment, the transformation 198 of the electrical data utilizes a polar plot of data, such as that acquired over the course of a season. The transformation process includes retrieving 200 the data from storage then creating 202 a polar plot of the desired electrical parameters for each branch circuit. As will be discussed in more detail below, exemplary polar plots are illustrated in FIGS. 11-19. The polar plots may then be analyzed 204 against predetermined criteria and thresholds to determine branch circuit operating characteristics such as inefficiency, imbalance and overload for example. From the graphical depiction of the electrical parameters, an assessment 206 of the branch circuit and planning activities may be performed.

Figure 9:
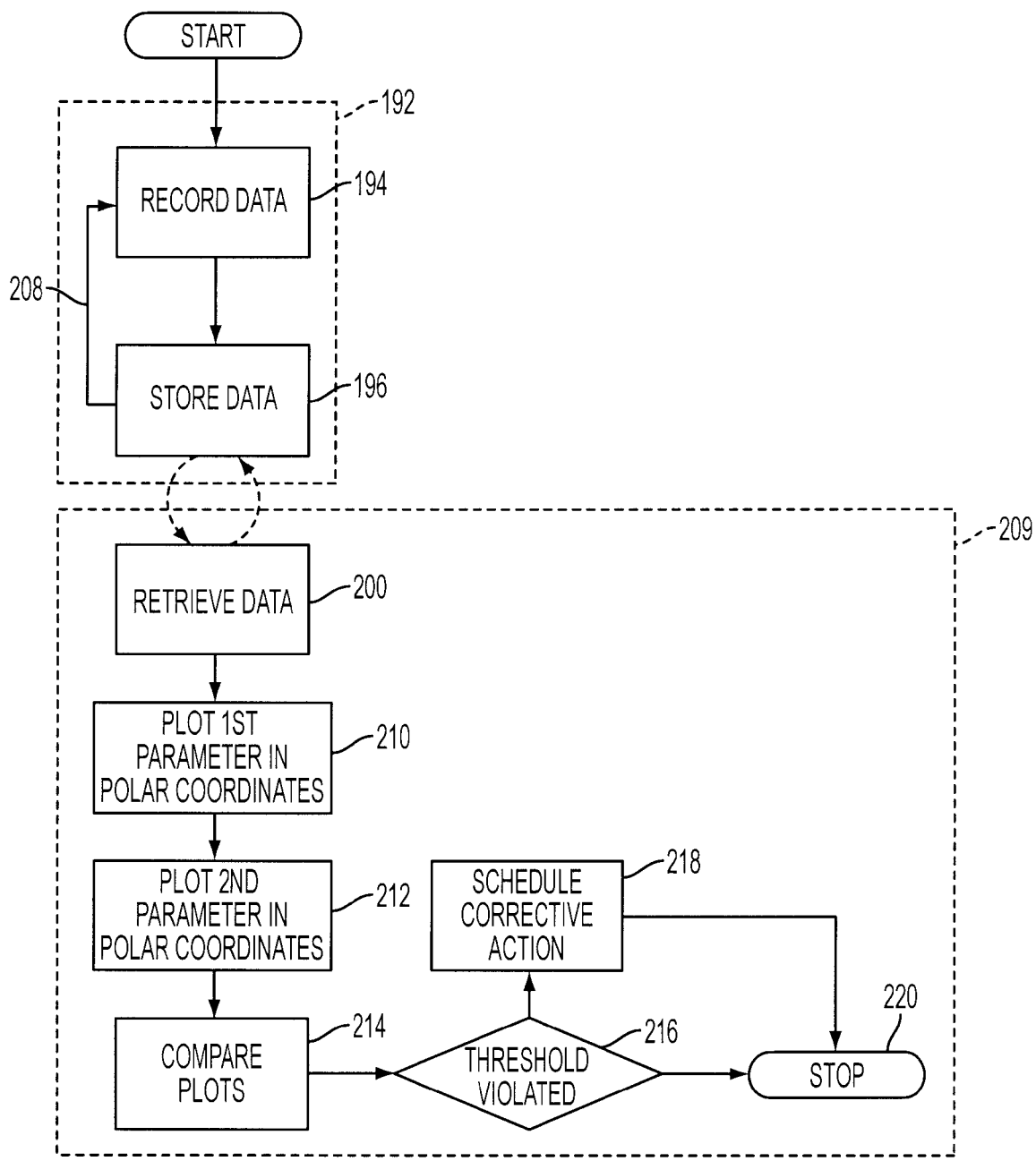
FIG. 9 is another schematic block diagram illustration of a process for assessing a circuit in accordance with one embodiment of the invention.

Another embodiment of the process 184 is illustrated in FIG. 9. In this embodiment, the data is collected 192 by recording 194 and storing 196 the data as described herein above. It should be appreciated that this process of recording and storing data occurs on a continual basis as indicated by the arrow 208 that loops the process back from the data storage 196 step to the data recording 194 step. It should further be appreciated that the data collection process 192 occurs in parallel with the data transformation process 209.

The data transformation process 209 first retrieves 200 the desired data from storage. The process 209 then plots a first electrical parameter in polar coordinates in block 210 to create a polar plot. A second electrical parameter is then plotted on the same polar plot in block 212. The two plots are then compared in block 214 and it is determined if a threshold or criteria has been violated in block 216. It should be appreciated that depending on the type of parameters being analyzed, the criteria may be violated by exceeding or falling below the threshold.

Figure 11:
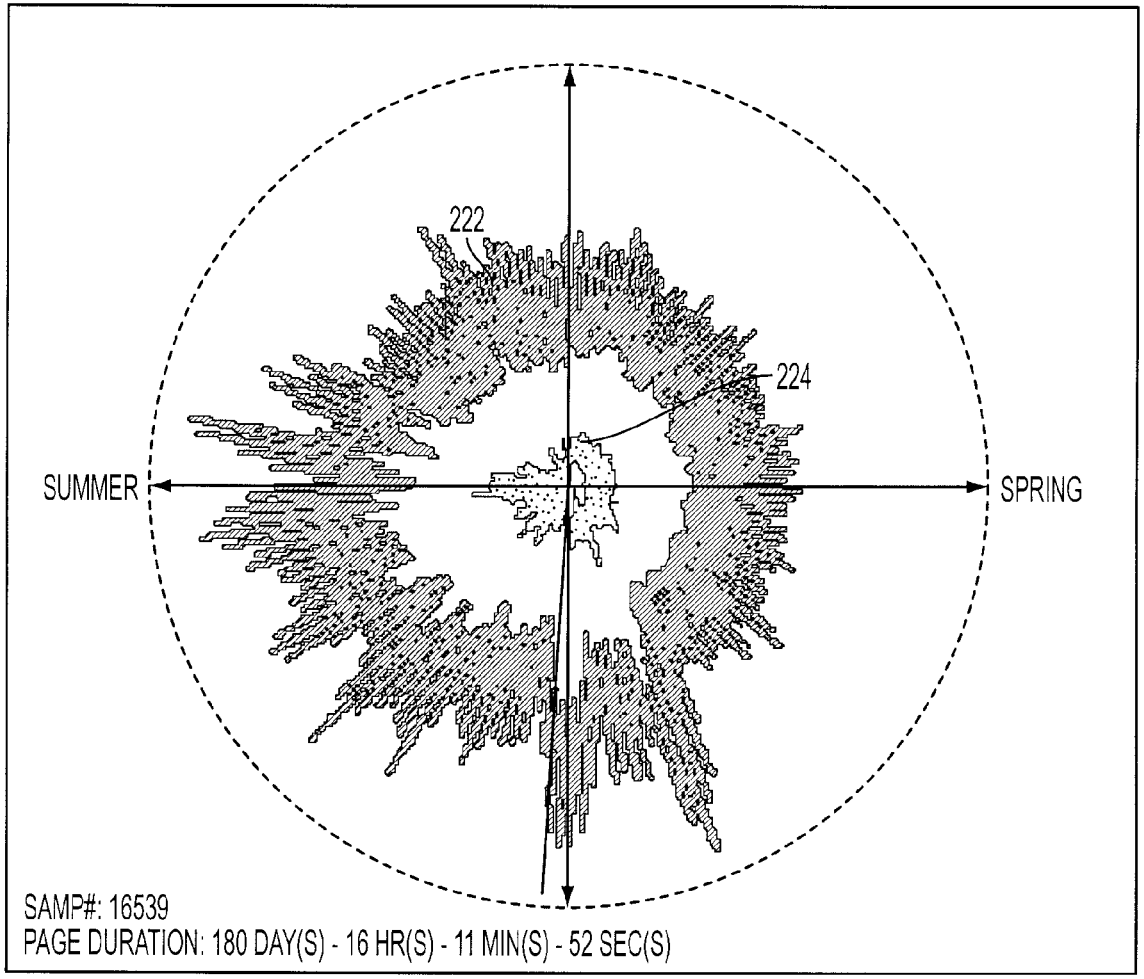
FIG. 11 is a two dimensional polar plot of real power and reactive power for assessing electrical circuit efficiency.
Figure 12:
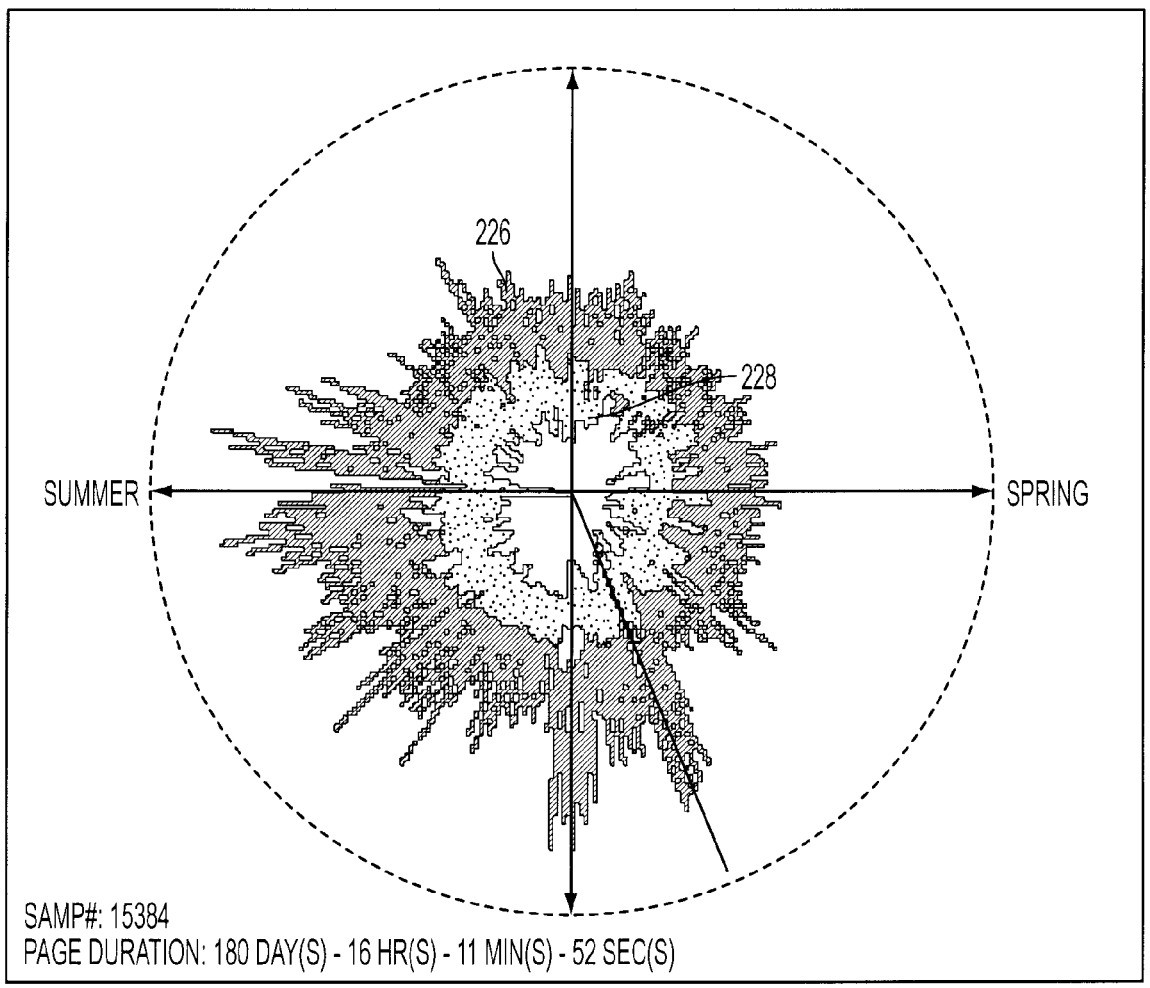
FIG. 12 is another two dimensional polar plot of real power and reactive power for assessing electrical circuit efficiency.
Figure 13:
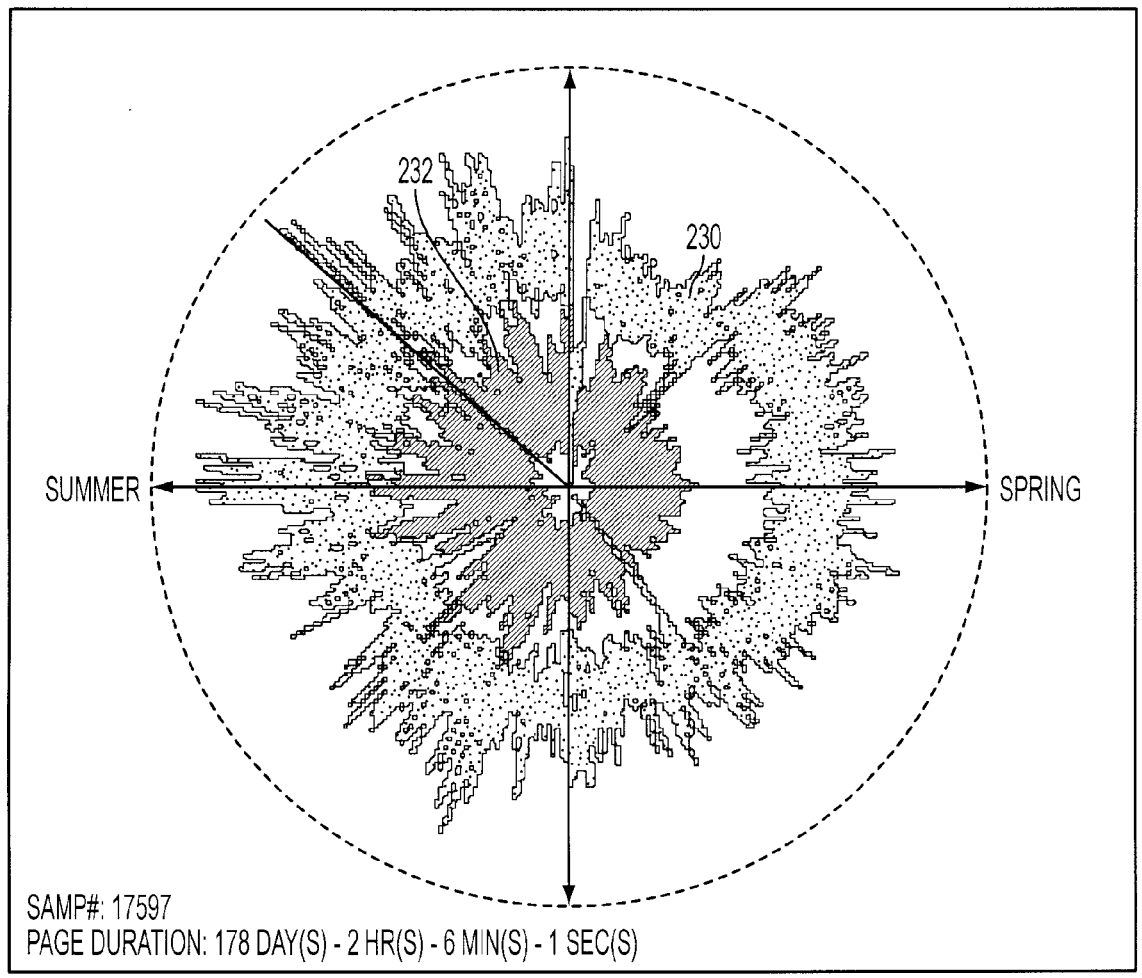
FIG. 13 is another two dimensional polar plot of real power and reactive power for assessing electrical circuit efficiency.

If query block 216 returns a positive, corrective actions are requested to bring performance of the branch circuit to within desired operating parameters in block 218. The process 209 then proceeds to stop block 220. FIGS. 11-13 illustrate one embodiment of process 198 where the level of inefficiency within a branch circuit is evaluated. The level of inefficiency is an indicator of the power factor. Since the cost of each branch circuit depends on the peak current it is designed to transfer, a branch circuit that is designed to handle the higher currents caused by loads with low power factor will cost more than a circuit that delivers the same useful energy to loads with a power factor closer to 1.

Inefficiency in the branch circuit is analyzed by plotting the measured real power (Mwatt) and the reactive power (Mvar) on the polar plot. If the power factor is close to one as desired, the real power data 222 will completely surround the reactive power 224 as illustrated in FIG. 11 where the power factor is greater than 0.9. As the power factor starts to decrease, the real power 226 and reactive power 228 will start to overlap as illustrated in FIG. 12 where the power factor is 0.5. Finally, in a severely inefficient circuit, the reactive power 230 exceeds the real power 232 as illustrated in FIG. 13 where the power factor is less than 0.2. In the polar plots illustrated in FIGS. 11-13, the data analyzed was accumulated over a period of 180 days and is arranged such that the data collected during the spring is arranged on the right side of the plot while the data collected during the summer is on the left side. It should be appreciated that this method of assessing circuits provides advantages as the utility engineer can scan through a large number of circuit plots and identify which circuits need attention. Further, seasonal variances may be seen and accounted for. Additionally, if polar plots from multiple years are compared, trends may be seen that would otherwise not be apparent.

Figure 10:
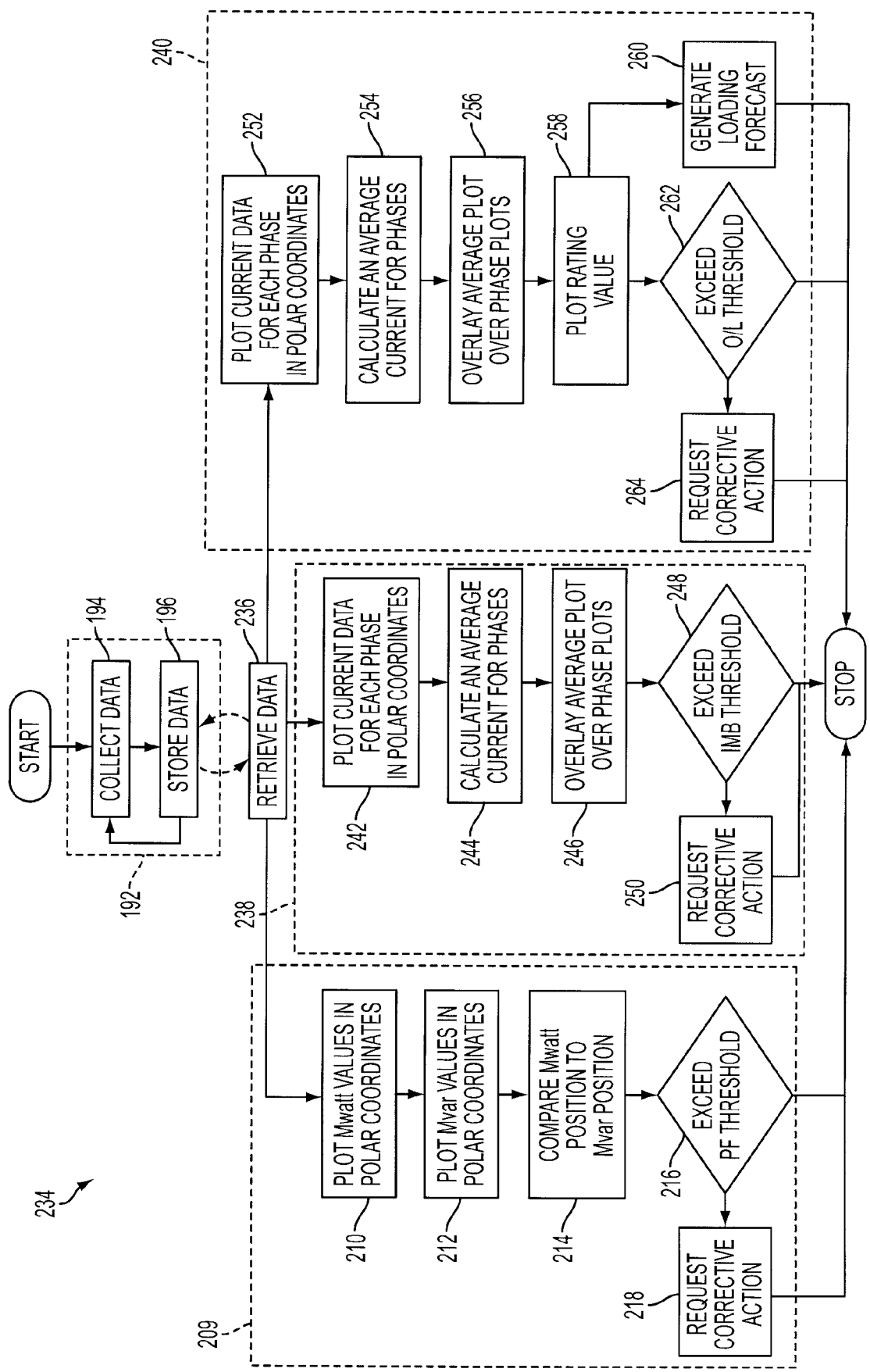
FIG. 10 is another schematic block diagram illustration of a process for assessing a circuit in accordance with one embodiment of the invention.

Another embodiment of a process 234 for assessing circuits is illustrated in FIG. 10. Similar to the embodiments discussed above, the process 234 starts by collecting data 192 including recording 194 and storing 196 the data. When an assessment of the circuit is needed, the process 234 retrieves the data in block 236. The process 234 then trifurcates into three different analysis processes 209, 238, 240 that operate in parallel. It should be appreciated that inefficiency 209 is identical to that discussed above in reference to FIG. 9.

Process 238 determines the level of imbalance within the branch circuit. Imbalance is a measure of the difference between the currents in each of the phases in the three-phase circuit. Imbalance occurs when one or more of the phases are at the top of its range (e.g. 110% nominal), while another is at the lower end of its range (e.g. 90% nominal). An imbalanced condition within a three-phase circuit may result in stray voltages which are undesired.

Figure 14:
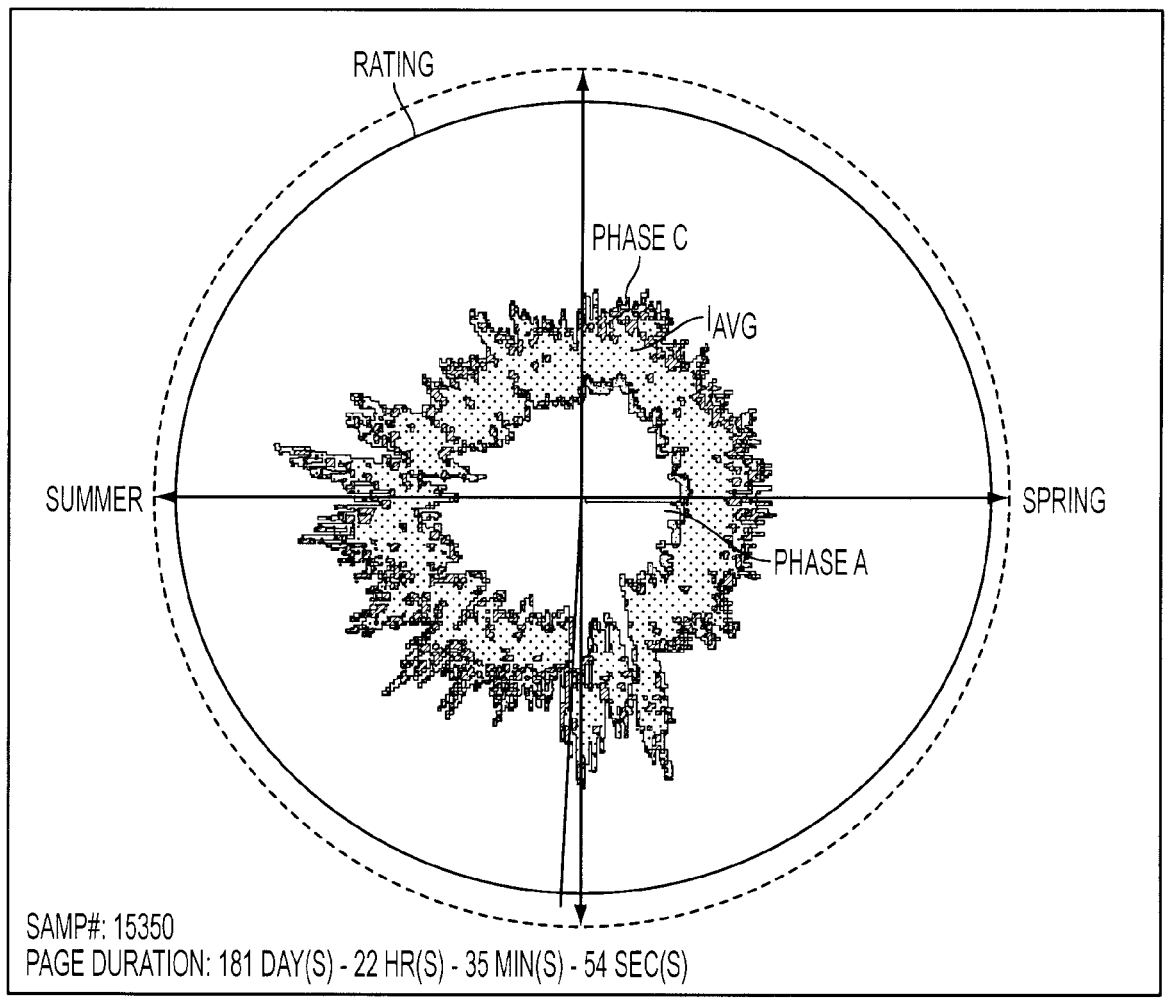
FIG. 14 is a two dimensional polar plot of electrical current for each phase of an electrical circuit for assessing imbalance.

To evaluate a circuit for imbalance, the process 238 first plots the electrical current data for each phase of the branch circuit on a polar plot in block 242. An average electrical current for the three phases is then calculated in block 244. The average current values are then plotted on the polar plot to overlay the current plots for the individual phases in block 246. If the average current substantially covers the data from the individual phases, then the current for the individual phases is also substantially balanced as illustrated in FIG. 14 where the imbalance is less than 10%. If one of the phases deviates from the average current, data for the imbalanced phase will be visible on the polar plot. In the embodiment of FIG. 14, only a small portion of "A" phase data is visible around the inside of the average current data and a small amount of the "C" phase data is visible around the outside of the average current data.

Figure 15:
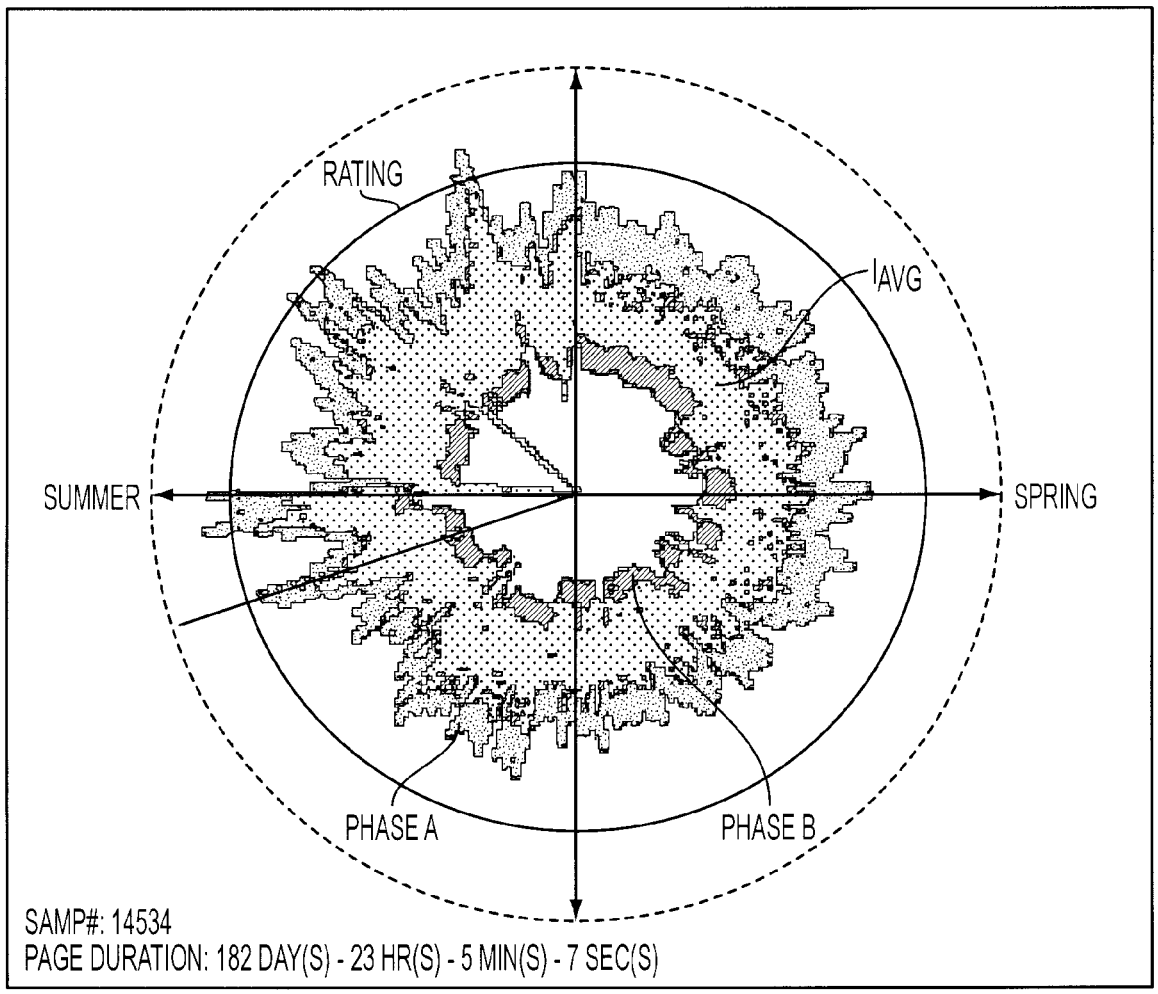
FIG. 15 is another two dimensional polar plot of electrical current for each phase of an electrical circuit for assessing imbalance.
Figure 16:
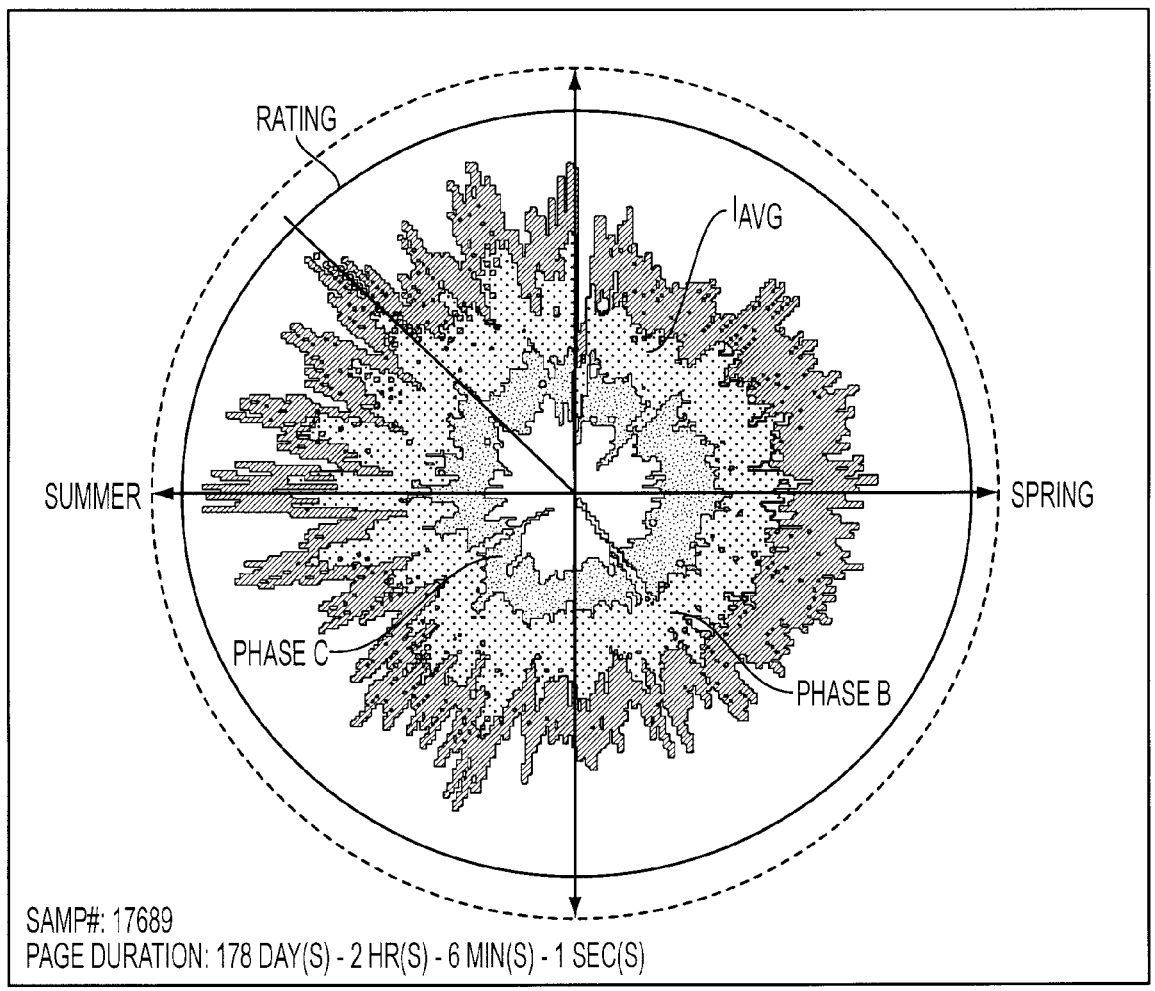
FIG. 16 is another two dimensional polar plot of electrical current for each phase of an electrical circuit for assessing imbalance.
Figure 17:
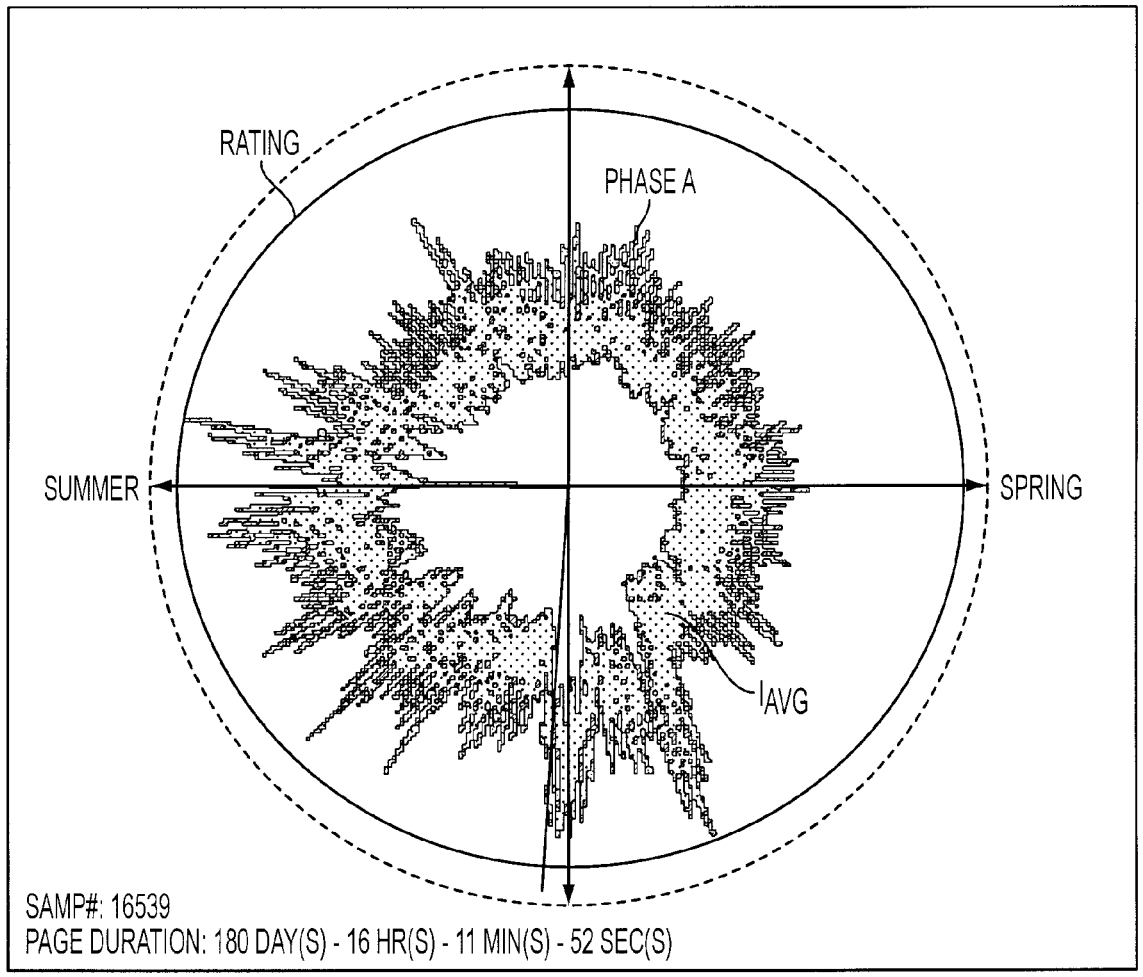
FIG. 17 a two dimensional polar plot of electrical current for each phase of an electrical circuit for assessing overload conditions.
Figure 18:
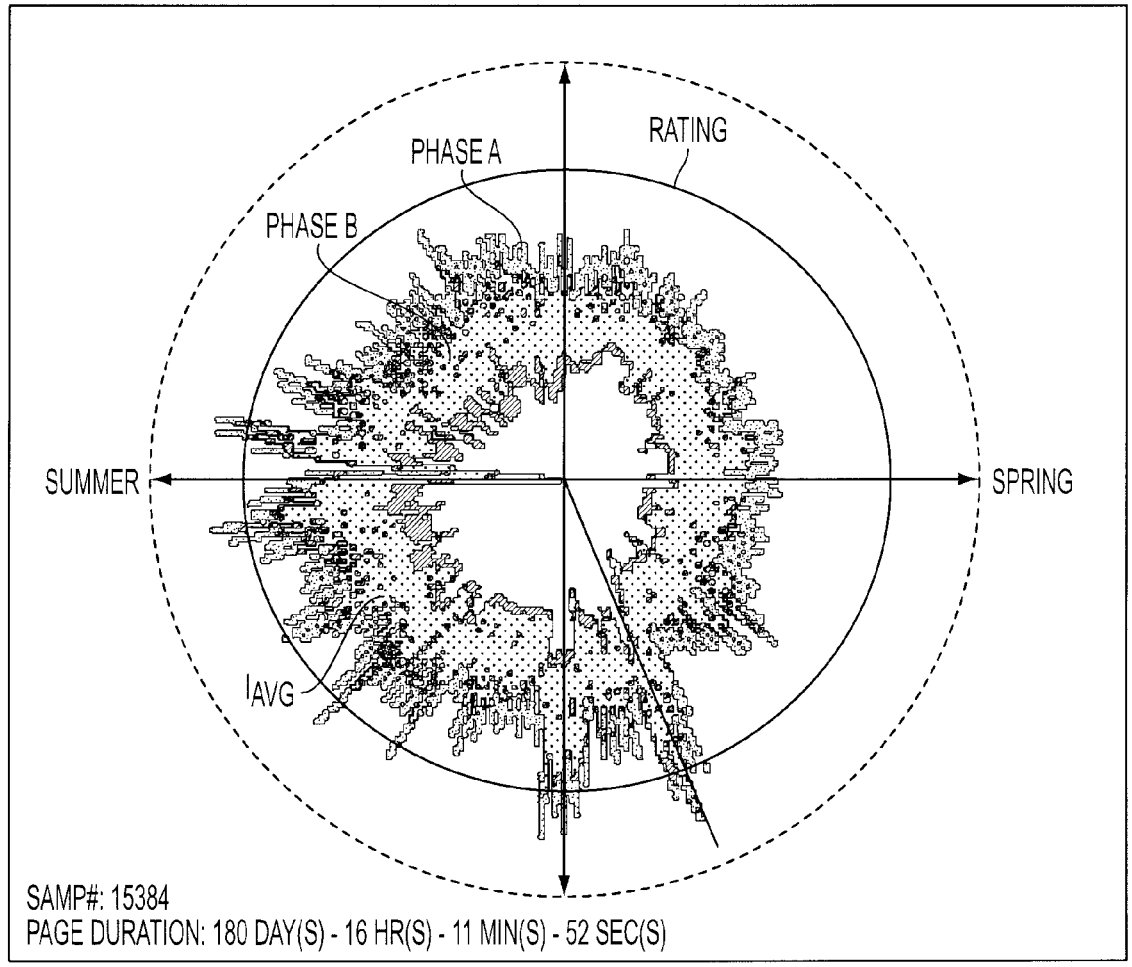
FIG. 18 is another two dimensional polar plot of electrical current for each phase of an electrical circuit for assessing overload conditions.
Figure 19:
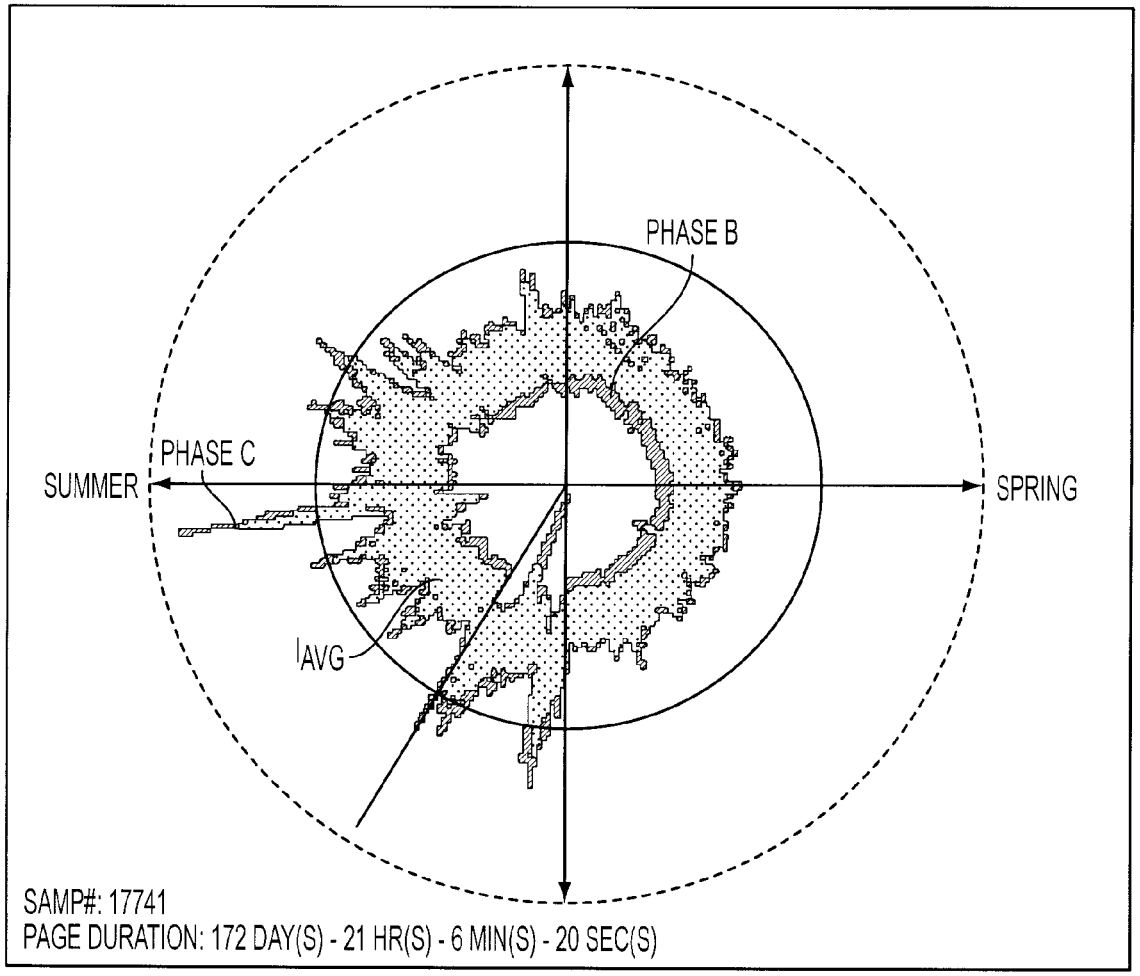
FIG. 19 is another two dimensional polar plot of electrical current for each phase of an electrical circuit for assessing overload conditions.

FIG. 15 illustrates a circuit where the imbalance is approximately 50%. In this embodiment, the "A" phase is clearly visible around the outside of the average current data set and the "B" phase data is visible around the inside of the average current data. Similarly, FIG. 16 illustrates a circuit where the imbalance is approximately 60%. In this embodiment, the "C" phase is clearly visible around the inside of the average current data set and the "B" phase data is visible around the outside of the average data set.

Once the average current data is overlaid on the polar plot, the process 238 determines whether a threshold has been violated in block 248. In general, when the imbalance approaches or exceeds 50%, corrective action is required. Thus, if the threshold has been violated, the process 238 proceeds to block 250 where corrective action measures are requested.

The third process 240 provides a measure of the amount of overload the branch circuit has experienced during the period being analyzed. Similar to the imbalance evaluation, the process 240 first starts by plotting the currents for each phase on a polar plot in block 252. The average current for the three phases is then calculated in block 254 and overlaid on the polar plot in block 256. Next, the process 240 plots an electrical current rating value 258 on the polar plot. The current rating value represents the maximum desired current for a given branch circuit. Typically, the current rating remains constant and is a circle on the polar plot.

In one embodiment, the process 240 bifurcates and provides a loading forecast for the branch circuit in block 260. The loading forecast may combine the historical data represented on the polar plot and correlate the data to other factors, such as temperature that effect demand on the circuit. A forecast may then be made for the expected current levels based on current weather predictions for example.

The process 240 also proceeds to query block 262 where the circuit is assessed to determine if an overload threshold has been exceeded. If the threshold is exceeded, the process 240 proceeds to block 264 where corrective actions are requested. In the exemplary embodiment, the overload threshold is indicated in terms of a percentage-exceeded value. For example, if the rating is 1 Mwatt, and the peak current experienced during the assessed period is 1.5 Mwatts, then the overload would be 50%. In the embodiment illustrated in FIG. 17, the average current has a peak that exceeds the rating value by 5%, whereas the embodiment of FIG. 18 has an average current with a number of peaks that exceed the rating value with a peak current exceeding the rating value by 30%. Similarly, the embodiment of FIG. 19 has an average current that has peak values that exceed the rating value by 64%. The overload analysis may be used in a number of contexts. For example, if a new load is being installed, such as a new residential development for example, the utility can use the overload plot to determine the level of capacity that remains within a given circuit. If only a small gap remains between the typical current levels and the rating value, the circuit has little capacity remaining for the additional load and the utility can then evaluate other circuits in the area to determine which circuit the load should be connected to.

The systems and methods disclosed herein may provide a number of advantages in the assessment of electrical circuits. The systems and methods may allow the monitoring of large quantities of data from multiple pieces of electrical equipment with minimal involvement from utility personnel. The systems and methods may provide for the analysis of the large quantity of data and the reporting of errors, faults and issues on an exception basis to further avoid overloading the utility personnel with irrelevant data. The systems and methods may also provide a means for collecting and analyzing historical data to determine operational characteristics such as inefficiency, imbalance and overload conditions. Finally, these systems and methods may further provide a means for locating trends and seasonal variations.

An embodiment of the invention may be embodied in the form of computer-implemented processes and apparatuses for practicing those processes. The present invention may also be embodied in the form of a computer program product having computer program code containing instructions embodied in tangible media, such as floppy diskettes, CD-ROMs, hard drives, USB (universal serial bus) drives, or any other computer readable storage medium, such as random access memory (RAM), read only memory (ROM), or erasable programmable read only memory (EPROM), for example, wherein, when the computer program code is loaded into and executed by a computer, the computer, as part of a programmable controller, becomes an apparatus for practicing the invention. Execution of the method includes interaction between the controller and the medium voltage switches installed on the feeders to verify the status of the switches, prior and after the commands are issued for their operation. The present invention may also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein when the computer program code is loaded into and executed by a computer, the computer becomes an apparatus for practicing the invention. When implemented on a general-purpose microprocessor, the computer program code segments configure the microprocessor to create specific logic circuits. A technical effect of the executable instructions is to manage the collection and presentation of data recorded at an electrical substation and the assessment of electrical circuits.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of identifying a relay, said method operable via a processor, said method comprising:
    coupling a first plurality of sensors to a relay trip ladder, wherein each of said first plurality of sensors is associated with one of a plurality of relays;
    collecting a first electrical data from said first plurality of sensors;
    identifying a trip signal on said trip ladder;
    determining a first relay of said plurality of relays from said first electrical data, wherein said first relay generated said trip signal;
    coupling a second plurality of sensors to a secondary side of a current transformer, wherein each of said second plurality of sensors is associated with one of said plurality of relays;
    collecting a second electrical data from said second plurality of sensors;
    determining a second relay from said second electrical data, wherein said second relay detected an electrical anomaly; and,
    generating an exception report indicating said trip signal and said identified relay, said exception report including a time, duration and description of the exception.

2. The method of claim 1, further comprising the step of determining said second relay identified as generating said trip signal also detected an electrical anomaly.

3. The method of claim 2, further comprising the step of generating an exception report when said first relay did not detect an electrical anomaly.

4. The method of claim 2, further comprising the step of generating an exception report when said first relay identified as detecting an electrical anomaly did not generate a trip signal.

5. The method of claim 2 further comprising:
    coupling a current sensor to a circuit breaker;
    collecting a third electrical data from said current sensor; and,
    measuring the length of time from the initiation of said trip signal to the opening of a circuit breaker electrically coupled to said trip ladder.

6. The method of claim 1, further comprising:
    determining if said trip signal is detected at different current levels by said first plurality of sensors; and,
    determining a third relay from said first electrical data, wherein said sensor from said first plurality of sensors associated with said third relay measured said trip signal at a different current level from said sensor of said first plurality of sensors that is associated with said first relay.

7. A method of identifying an activated relay in a protective relay cabinet, where said protective relay cabinet includes a first relay, a second relay and a third relay, each of said first relay, said second relay and said third relay being operably coupled to a circuit breaker by a trip ladder, said method operable via a processor, said method comprising:
    coupling a first sensor to said trip ladder adjacent said first relay;
    coupling a second sensor to said trip ladder adjacent said second relay;
    coupling a third sensor to said trip ladder adjacent said third relay;
    detecting a trip signal on said trip ladder;
    determining which of said first sensor, said second sensor and said third sensor measured said trip signal;
    determining said second relay generated said trip signal;
    coupling a fourth sensor to a secondary connection of a first current transformer associated with said first relay;
    coupling a fifth sensor to a secondary connection of a second current transformer associated with said second relay;
    coupling a sixth sensor to a secondary connection of a third current transformer associated with said third relay;
    detecting an electrical anomaly on said fourth sensor; and,
    determining if said second relay generated said trip signal;
    generating an exception report if said fifth sensor measured an electrical anomaly and said second relay did not generate said trip signal said exception report including a time, duration and description of the exception.

8. The method of claim 7 further comprising determining if said first sensor detected said trip signal at a current level that was larger than said second sensor.

9. A system of assessing an electrical circuit on an electrical utility network, said system comprising a processor configured to perform a method, said method comprising:
    collecting a first data set of a first electrical parameter current during a first time period representing a first electrical parameter on a portion of said electrical utility network;
    collecting a second data set of said first electrical parameter during a second first time period representing a second electrical parameter on a portion of said electrical utility network;
    creating with said processor a graphical plot of said first data set and said second data set;
    comparing with said processor a characteristic of said graphical plot to a threshold parameter;

determining that said threshold parameter has been violated by said characteristic.

10. The system of claim 9 further comprising the step of initiating an action when said threshold parameter has been violated.

11. The system of claim 10 further comprising the step of overlaying said second data set on said first data set.

12. The system of claim 11 wherein said characteristic is a percentage of the area of the first data set that is visible.

13. The system of claim 11 wherein said threshold is a rating parameter for the circuit.

14. The system of claim 13 wherein said characteristic is a percentage of a peak current to said rating parameter.

15. The system of claim 11 wherein said threshold parameter is violated if said second data set is positioned radially outward of said first data set.

16. The system of claim 15 wherein said first data set is real power data and said second data set is reactive power data.

17. The system of claim 12 further comprising:
collecting a third data set representing a third electrical parameter;
collecting a fourth data set representing a fourth electrical parameter;
creating a polar plot of said first data set, said second data set, said third data set and said fourth data set, wherein said second data set overlays said first data set, said third data set and said fourth data set; and,
wherein said second data set is an average of said first data set, said third data set and said fourth data set.

18. The system of claim 17 wherein said first data set is a first electrical phase current, said third data set is a second electrical phase current, and said fourth data set is a third electrical phase current.

19. A system of assessing an electrical circuit on an electrical utility network, said system having a processor configured to perform a method, said method comprising:
collecting a first data set representing a first electrical parameter on a portion of said electrical utility network;
collecting a second data set representing a second electrical parameter on said portion of said electrical utility network;
collecting a third data set representing a third electrical parameter on said portion of said electrical utility network;
storing on a tangible storage medium said first data set, said second data set and said third data set;
generating with said processor a polar plot of said stored first data set, said stored second data set, and said stored third data set;
comparing with said processor a characteristic of said polar plot to a threshold parameter;
transmitting an alarm signal with said processor if said threshold parameter has been violated by said characteristic.

20. The system of claim 19 further comprising:
calculating a fourth data set by averaging said stored first data set, said stored second data set and said stored third data set; and,
overlaying said fourth data set on said polar plot.

21. The system of claim 20 wherein said threshold parameter is a percentage of an area of said fourth data set that covers said stored first data set, said stored second data set and said stored third data set on said polar plot.

22. The system of claim 20 further comprising the step of generating a rating line on said polar plot.

23. The system of claim 22 wherein said threshold parameter is a percentage of a peak current from said fourth data set to said rating line.

24. The system of claim 23 wherein said first electrical parameter represents electrical current from a first electrical phase, said second electrical parameter represents electrical current from a second electrical phase, and said third electrical parameter represents electrical current from a third phase.

25. A system for assessing an electrical circuit on an electrical utility network, said system comprising:
a first sensor measuring a first electrical parameter of said electrical circuit on a portion of said electrical utility network;
a second sensor measuring a second electrical parameter of said electrical circuit on a portion of said electrical utility network;
a data storage device operably coupled to store data received from said first sensor and said second sensor; and,
a controller responsive to executable computer instructions when executed on the controller for generating a polar plot of said stored data, said controller further responsive to executable instructions to compare a characteristic of said polar plot to a threshold parameter, determining if said threshold parameter has been exceeded and transmitting an alarm signal in response to said threshold parameter.

26. The system of claim 25 wherein:
said controller is further responsive to calculate an average of said stored data and said characteristic is determined from said calculated average; and,
said first electrical parameter is an electrical current for a first phase of said electrical circuit and said second electrical parameter is an electrical current for a second phase of said electrical circuit.

27. The system of claim 25 wherein:
said characteristic is a relative position of said stored data from said first sensor to a position of said stored data from said second sensor;
said first electrical parameter is real power flowing through said electrical circuit; and,
said second electrical parameter is reactive power flowing through said electrical circuit.

* * * * *